(12) United States Patent
Su et al.

(10) Patent No.: US 11,804,486 B2
(45) Date of Patent: Oct. 31, 2023

(54) BACKSIDE POWER RAIL AND METHODS OF FORMING THE SAME

(71) Applicant: TAIWAN SEMICONDUCTOR MANUFACTURING CO., LTD., Hsinchu (TW)

(72) Inventors: Huan-Chieh Su, Changhua County (TW); Li-Zhen Yu, Hsinchu (TW); Chun-Yuan Chen, Hsinchu (TW); Shih-Chuan Chiu, Hsinchu (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/572,212

(22) Filed: Jan. 10, 2022

(65) Prior Publication Data

US 2022/0130823 A1     Apr. 28, 2022

Related U.S. Application Data

(63) Continuation of application No. 16/901,963, filed on Jun. 15, 2020, now Pat. No. 11,222,892.

(51) Int. Cl.
*H01L 27/088* (2006.01)
*H01L 21/027* (2006.01)
*H01L 21/308* (2006.01)
*H01L 21/306* (2006.01)

(52) U.S. Cl.
CPC ...... *H01L 27/0886* (2013.01); *H01L 21/0274* (2013.01); *H01L 21/3086* (2013.01); *H01L 21/30604* (2013.01)

(58) Field of Classification Search
CPC ........... H01L 21/8221; H01L 29/78696; H01L 29/42392; H01L 27/0886; H01L 21/0274; H01L 21/30604; H01L 21/3086
See application file for complete search history.

(56) References Cited

U.S. PATENT DOCUMENTS

| | | | |
|---|---|---|---|
| 9,818,872 B2 | 11/2017 | Ching et al. |
| 9,887,269 B2 | 2/2018 | Ching et al. |
| 9,899,398 B1 | 2/2018 | Colinge et al. |
| 10,020,261 B2 | 7/2018 | Wu et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,269,715 B2 | 4/2019 | Wu et al. |
| 10,282,504 B2 | 5/2019 | Wu et al. |

(Continued)

*Primary Examiner* — Changhyun Yi
(74) *Attorney, Agent, or Firm* — HAYNES AND BOONE, LLP

(57) ABSTRACT

A semiconductor device according to the present disclosure includes a bottom dielectric feature on a substrate, a plurality of channel members directly over the bottom dielectric feature, a gate structure wrapping around each of the plurality of channel members, two first epitaxial features sandwiching the bottom dielectric feature along a first direction, and two second epitaxial features sandwiching the plurality of channel members along the first direction.

20 Claims, 22 Drawing Sheets

(56) References Cited

U.S. PATENT DOCUMENTS

| | | |
|---|---|---|
| 10,734,391 B2 | 8/2020 | Masuoka |
| 2018/0175036 A1 | 6/2018 | Ching et al. |
| 2019/0131394 A1 | 5/2019 | Reznicek |
| 2019/0131395 A1 | 5/2019 | Lee |
| 2019/0378842 A1* | 12/2019 | Reznicek .......... H01L 29/78696 |
| 2020/0294998 A1* | 9/2020 | Lilak ................. H01L 23/53295 |

* cited by examiner

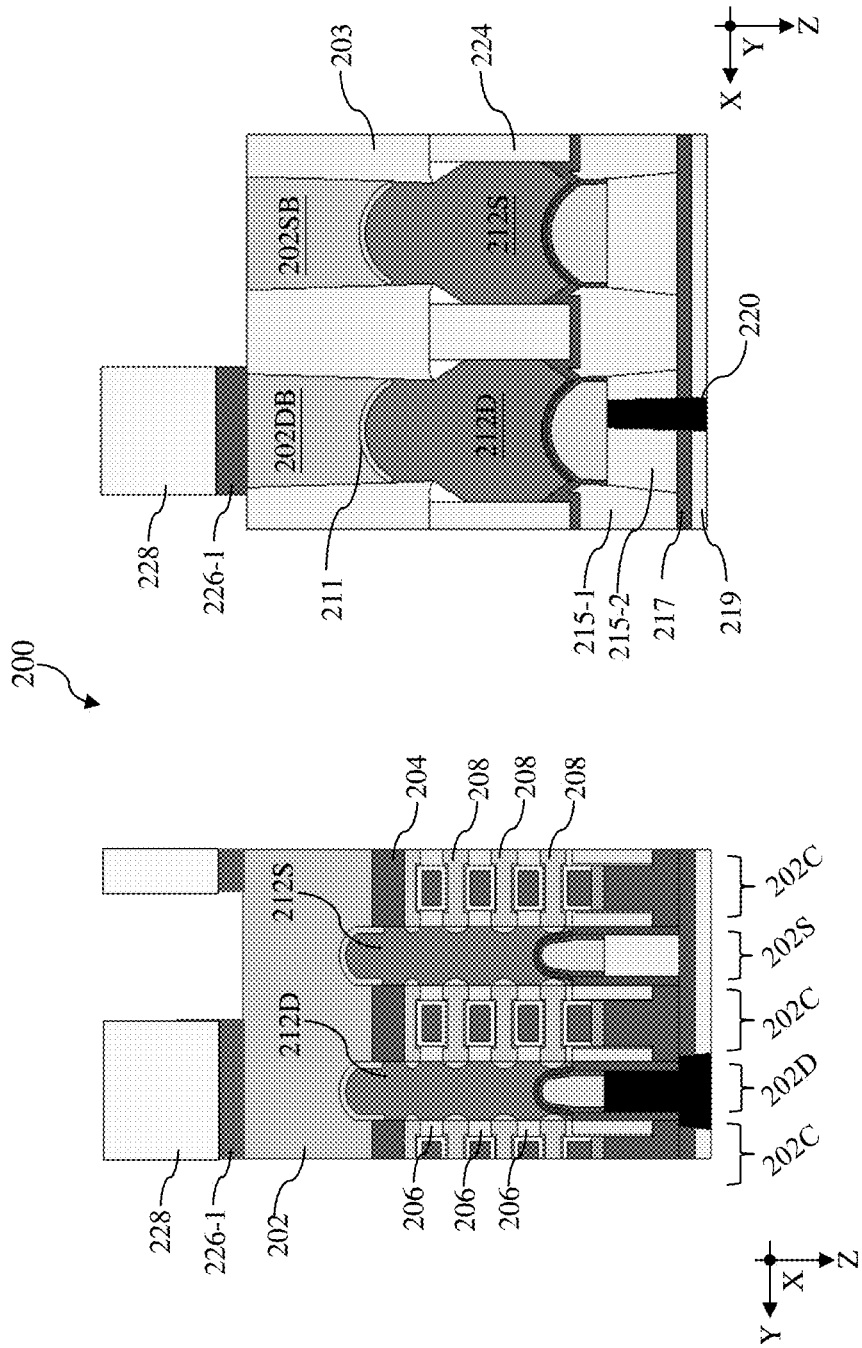

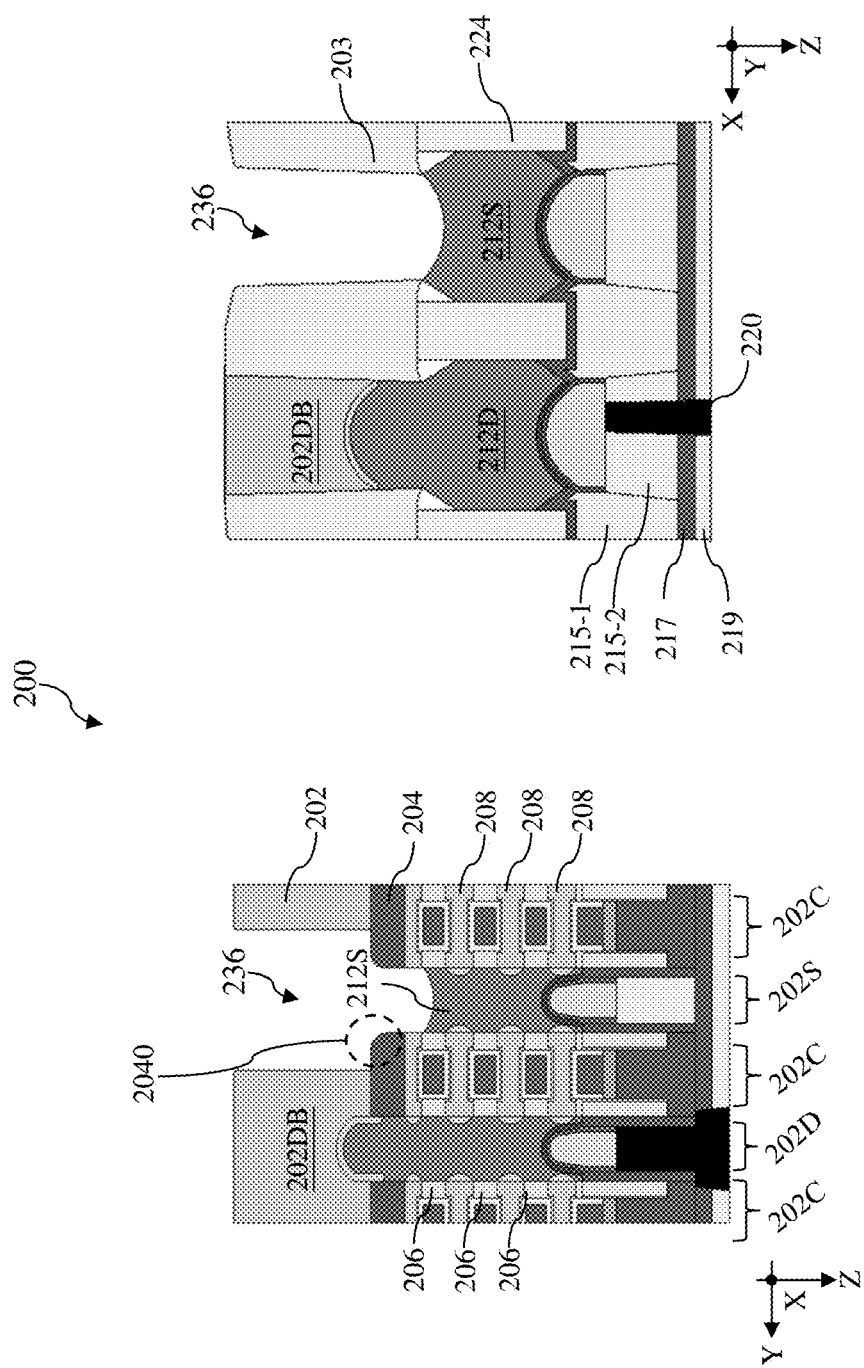

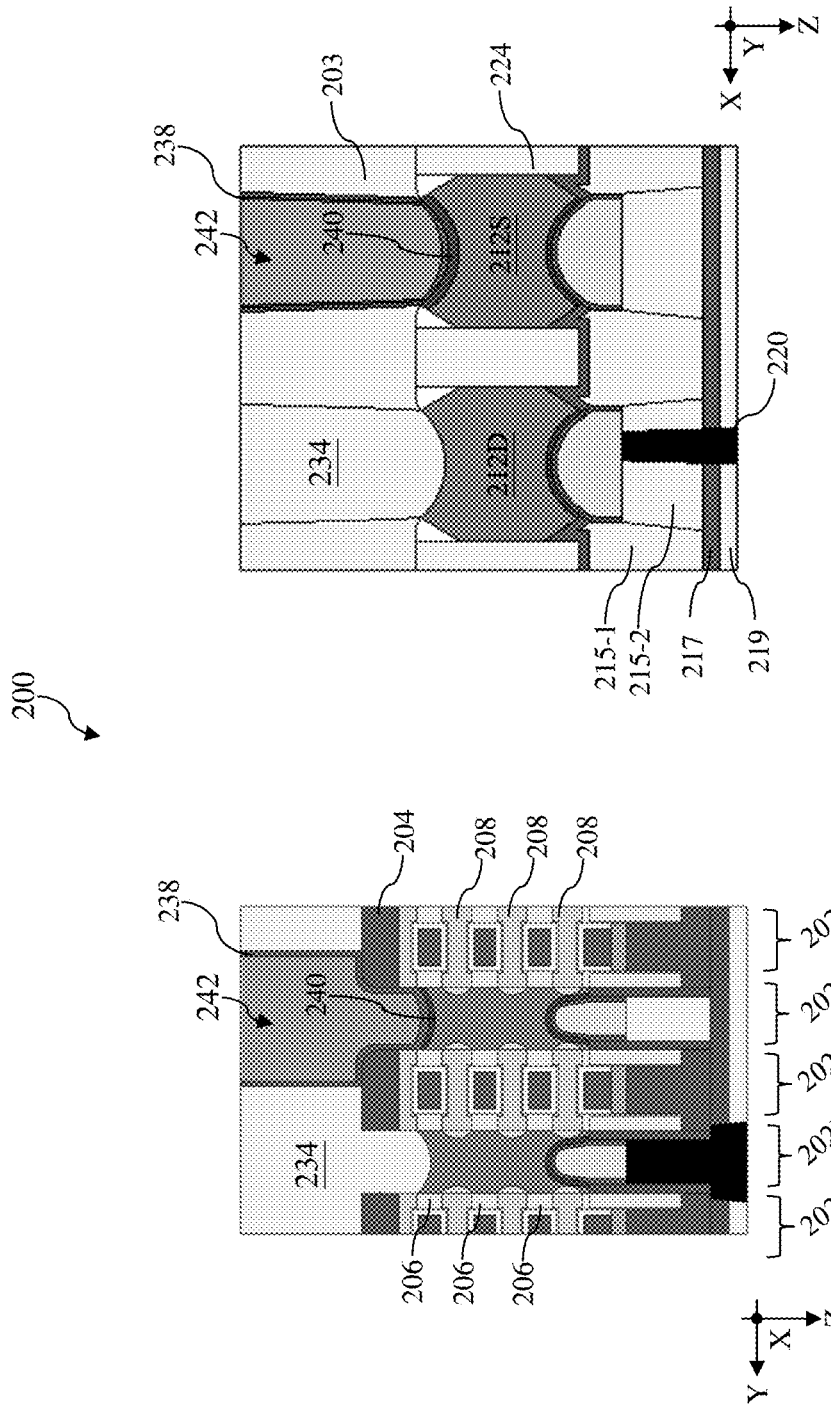

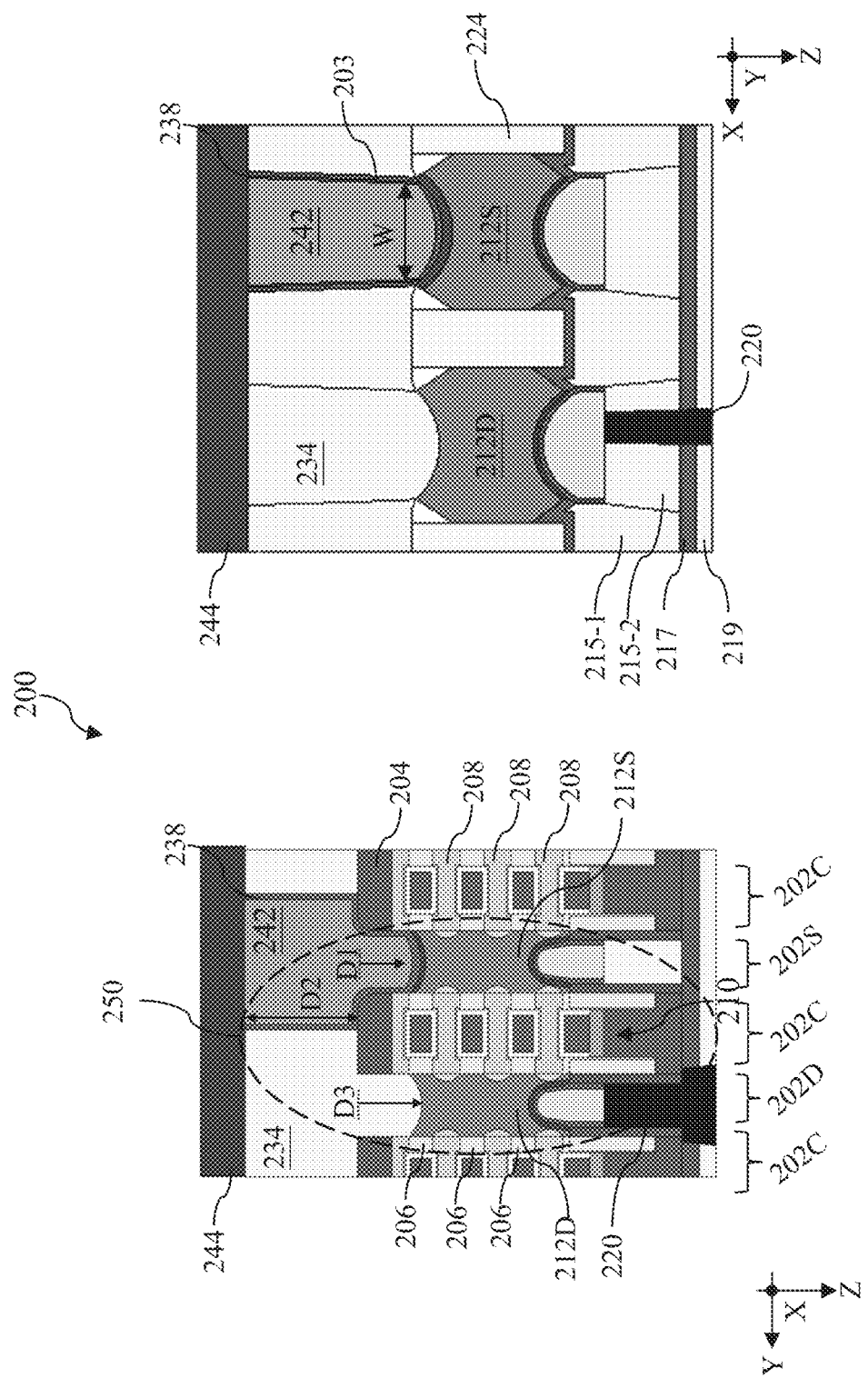

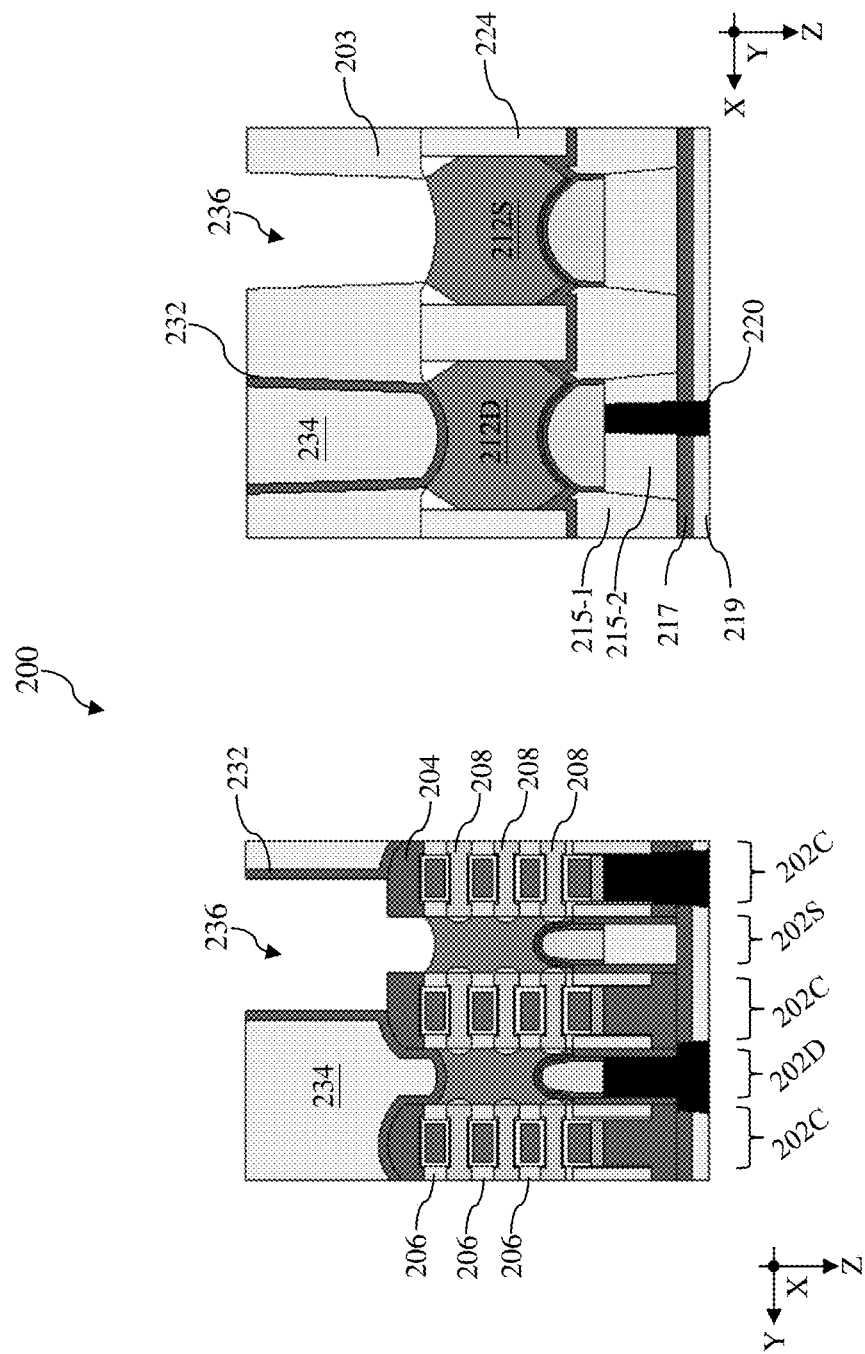

BACKSIDE POWER RAIL AND METHODS OF FORMING THE SAME

PRIORITY DATA

This application is a continuation application of U.S. patent application Ser. No. 16/901,963, filed Jun. 15, 2020, the entirety of which is incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, it has been proposed to move some routing features, such as power lines (also referred to as power rails) to a backside of the substrate. While conventional backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-9A and 2B-9B illustrate fragmentary cross-sectional views of a workpiece during a fabrication process according to the method of FIG. 1, according to one or more aspects of the present disclosure.

FIGS. 11A-22A and 11B-22B illustrate fragmentary cross-sectional views of a workpiece during a fabrication process according to the method of FIG. 10, according to one or more aspects of the present disclosure.

DETAILED DESCRIPTION

Figure 1:
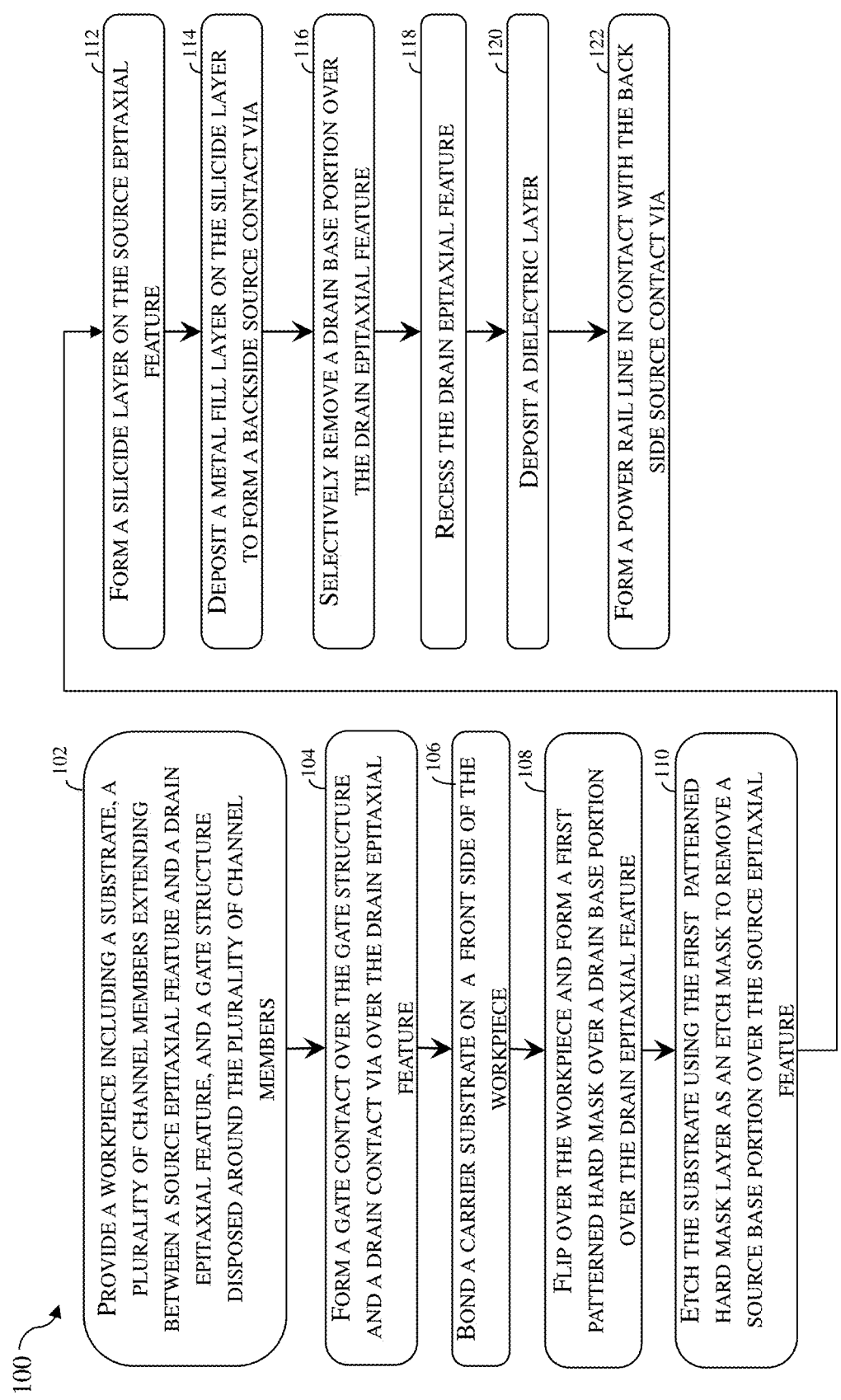
FIG. 1 illustrates a flow chart of a method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods thereof, and more particularly to multi-gate transistors having a backside power rail.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices may have channel regions disposed in nanowire channel members, bar-shaped channel members, nanosheet channel members, nanostructure channel members, bridge-shaped channel members, and/or other suitable channel configurations. In an MBC transistor, as the channel region is adjacent to the source/drain region, additional gate-drain capacitance may be formed between an epitaxial source/drain feature in the source/drain region and a gate structure in the channel region when the epitaxial source/drain feature extends to a level below a bottom surface of the gate structure.

The present disclosure provides embodiments of a semiconductor device that has a backside power rail and a reduced gate-drain capacitance. The source feature of a semiconductor device of the present disclosure is coupled to the backside power rail by a backside contact via and the drain feature is recessed to trim excess drain feature. As a result, the semiconductor device of the present disclosure has reduced gate-drain capacitance.

Figure 10:
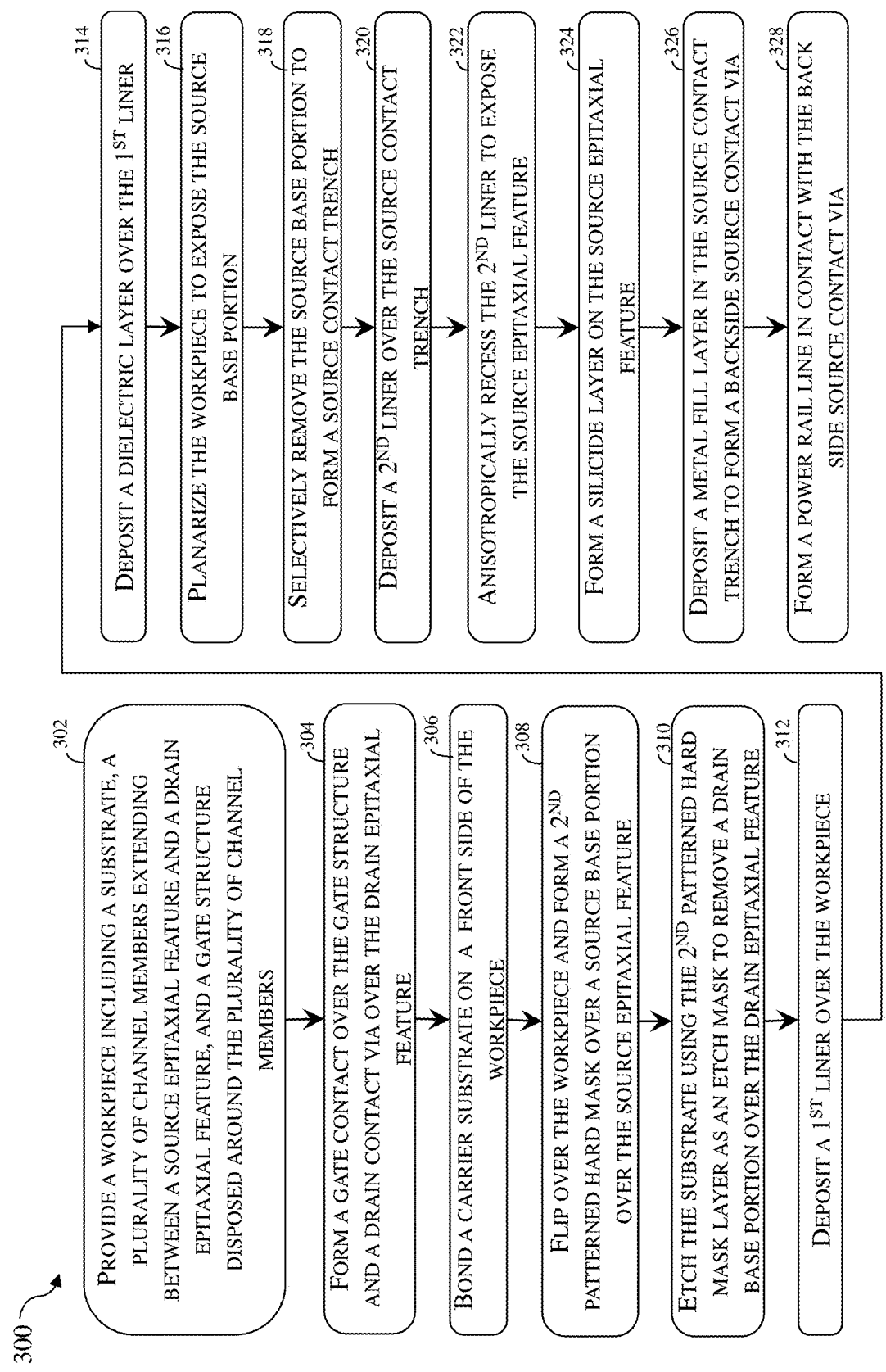
FIG. 10 illustrates a flow chart of an alternative method for forming a semiconductor device having a backside power rail, according to one or more aspects of the present disclosure.

The various aspects of the present disclosure will now be described in more detail with reference to the figures. In that regard, FIGS. 1 and 10 are flowcharts illustrating methods 100 and 300 of forming a semiconductor device from a workpiece according to embodiments of the present disclosure. Methods 100 and 300 are merely examples and are not intended to limit the present disclosure to what is explicitly illustrated in methods 100 and 300. Additional steps can be provided before, during and after the methods 100 and 300, and some steps described can be replaced, eliminated, or moved around for additional embodiments of the methods. Not all steps are described herein in detail for reasons of simplicity. Methods 100 and 300 are described below in conjunction with FIGS. 2A-9B (i.e, FIGS. 2A-9A and 2B-9B) and FIGS. 11A-22B (i.e, FIGS. 11A-22A and 11B-22B), respectively, which are fragmentary cross-sectional views of the workpiece at different stages of fabrication according to embodiments of methods 100 and 300. For better illustration of various aspects of the present disclosure, each of the figures ending with the capital letter A illustrates a fragmentary cross-sectional view of the workpiece 200 (or the semiconductor device 200) along the X direction, which is the lengthwise direction of a gate structure. Each of the figures ending with the capital letter B illustrates a fragmentary cross-sectional view of the workpiece 200 along the Y direction, which is the lengthwise direction of a fin-shaped structure.

Figures 2A, 2B:
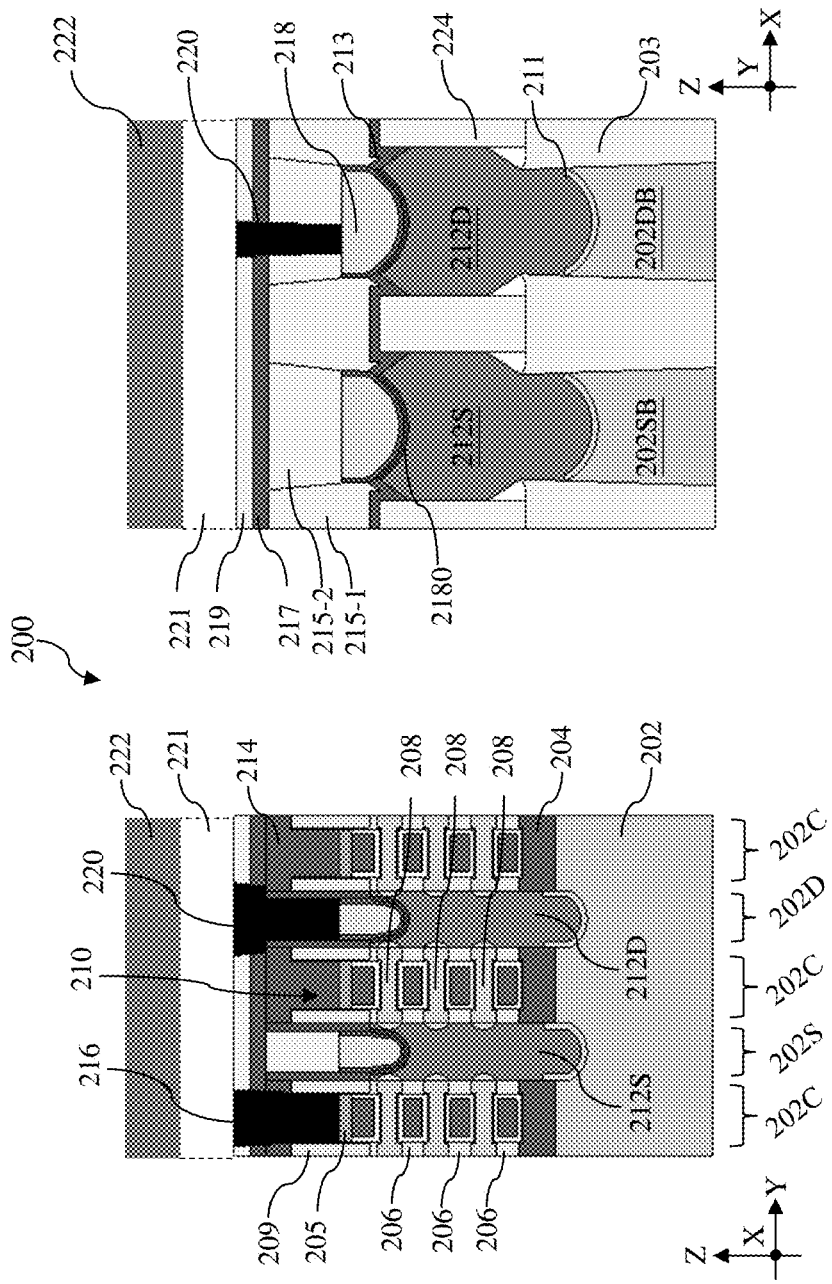

Referring to FIGS. 1, 2A and 2B, method 100 includes a block 102 where a workpiece 200 is provided. As shown in FIGS. 2A and 2B, the workpiece 200 includes a substrate 202. Over the substrate 202, the workpiece 200 includes a plurality of vertically stacked channel members 208 that extend between a source epitaxial feature 212S and a drain epitaxial feature 212D. A gate structure 210 is disposed over and wraps around each of the plurality of channel members 208. The formation of the plurality of channel members 208 may include formation of a fin-shaped structure that includes a portion of the substrate 202. As shown in FIG. 2B, a source base portion 202SB, which is formed from the substrate 202 is disposed below the source epitaxial feature 212S and a drain base portion 202DB, which is formed from the substrate 202, is disposed below the drain epitaxial feature 212D. Referring to FIG. 2A, the substrate 202, which may be a base portion of a fin-shaped structure, includes channel regions 202C interleaved by source/drain regions 202SD. The base portions of the substrate 202, such as the source base portion 202SB and the drain base portion 202DB, are isolated from one another by an isolation feature 203 shown in FIG. 2B. The source epitaxial feature 212S and the drain epitaxial feature 212D are disposed over source/drain regions 202SD and the gate structure 210 is disposed over a channel region 202C. The gate structure 210 is isolated from an adjacent source epitaxial feature 212S or an adjacent drain epitaxial feature 212D by a plurality of inner spacer features 206. The portion of the gate structure 210 that is above the topmost channel member 208 is lined by a gate spacer feature 209. The gate structure 210 is spaced apart from the substrate 202 by a bottom dielectric layer 204. In some embodiments, the source epitaxial feature 212S and the drain epitaxial feature 212D may include a foundation epitaxial feature 211. In some embodiments represented in FIG. 2B, the workpiece 200 may include a plurality of dielectric fins 224 to isolate the source epitaxial feature 212S and the drain epitaxial feature 212D. A gate self-aligned contact (SAC) dielectric layer 214 may be formed over each of the gate structures 210.

In some embodiments, the substrate 202 may be a semiconductor substrate such as a silicon substrate. The substrate 202 may also include other semiconductors such as germanium, silicon carbide (SiC), silicon germanium (SiGe), or diamond. Alternatively, the substrate 202 may include a compound semiconductor and/or an alloy semiconductor. In the depicted embodiment, the substrate 202 is a silicon substrate. For ease of reference, the substrate 202 and layers or features to be formed thereon may be collectively referred to as the workpiece 200. Because the workpiece 200 will be fabricated into a semiconductor device 200 upon conclusion of the fabrication processes, the workpiece 200 may be referred to as the semiconductor device 200 as the context requires. The channel members 208 may include a semiconductor material, such as silicon, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The isolation feature 203 may also be referred to as a shallow trench isolation (STI) feature 203. The isolation feature 203 may include silicon oxide, silicon nitride, silicon oxynitride, fluorine-doped silicate glass (FSG), a low-k dielectric, combinations thereof, and/or other suitable materials. The gate spacer feature 209 may be a single layer or a multi-layer. In some instances, the gate spacer feature 209 may include silicon oxide, silicon oxycarbide, silicon carbonitride, silicon nitride, zirconium oxide, aluminum oxide, a suitable low-k dielectric material, or a suitable dielectric material. The inner spacer features 206 may include silicon oxynitride, silicon carbonitride, silicon oxycarbide, silicon oxycarbonitride, silicon nitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. The bottom dielectric layer 204 may also be referred to as a bottom self-aligned contact (SAC) dielectric layer 204. In some instances, the bottom dielectric layer 204 may be formed of silicon oxide, silicon nitride, silicon oxycarbide, silicon oxycarbonitride, silicon carbonitride, or a suitable dielectric material. Along the Z-direction, the bottom dielectric layer 204 may have a thickness between about 5 nm and about 30 nm. Depending on the type of the devices, the source epitaxial feature 212S and the drain epitaxial feature 212D may include silicon doped with an n-type dopant, such as phosphorus (P) or arsenide (As), or silicon germanium doped with a p-type dopant, such as boron (B). Compared to the source epitaxial feature 212S and the drain epitaxial feature 212D, the foundation epitaxial feature 211 may be formed of a similar semiconductor material with a smaller doping concentration than the source epitaxial feature 212S or the drain epitaxial feature 212D. The gate SAC dielectric layer 214 may be formed of silicon oxide, hafnium silicide, silicon nitride, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon oxycarbonitride, zirconium nitride, silicon carbonitride, or a suitable dielectric material. The plurality of dielectric fins 224 may be a single layer or a multi-layer and may include a high-k (i.e., with a dielectric constant greater than 3.9) dielectric material or a low-k (i.e., with a dielectric constant equal to or smaller than 3.9) dielectric material. Example high-k dielectric materials include hafnium oxide, zirconium oxide, hafnium aluminum oxide, hafnium silicon oxide, and aluminum oxide. Example low-k dielectric materials include silicon carbonitride, silicon oxycarbide, and silicon oxycarbonitride.

While not explicitly shown in FIG. 2A, the gate structure 210 includes an interfacial layer, a gate dielectric layer over the interfacial layer, and a gate electrode over the gate dielectric layer. The interfacial layer may include a dielectric material such as silicon oxide, hafnium silicate, or silicon oxynitride. The gate dielectric layer may include a high-k dielectric material that has a dielectric material with a dielectric constant greater than that of silicon dioxide, which is about 3.9. In some instances, the gate dielectric layer may include hafnium oxide, zirconium oxide, zirconium aluminum oxide, hafnium aluminum oxide, hafnium silicon oxide, aluminum oxide, titanium oxide, tantalum oxide, lanthanum oxide, yttrium oxide, tantalum carbonitride, zirconium nitride, combinations thereof, or other suitable material. In some instances, the gate dielectric layer may have a thickness between about 5 nm and about 30 nm. The gate electrode may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof.

Referring still to FIGS. 1, 2A and 2B, method 100 includes a block 104 where a gate contact 216 and a drain contact via 220 are formed. In some embodiments, a contact etch stop layer (CESL) 213 is deposited over the workpiece 200. The CESL 213 may include silicon nitride, silicon oxide, silicon oxynitride, and/or other materials known in the art. The source/drain regions 202SD are then recessed to expose the source epitaxial feature 212S and the drain epitaxial feature 212D in front source/drain contact openings in the first dielectric layer 215-1. In some embodiments illustrated in FIGS. 2A and 2B, the source epitaxial feature 212S and the drain epitaxial feature 212D are recessed. Source/drain contacts 218 are then deposited over the source epitaxial feature 212S and the drain epitaxial feature 212D. In some embodiments illustrated in FIGS. 2A and 2B, a source/drain contact silicide layer 2180 may be deposited over the exposed source epitaxial feature 212S and drain epitaxial feature 212D before the deposition of the source/drain contacts 218. The front source/drain contact openings are then filled with a second dielectric layer 215-2. After the top surfaces of the workpiece 200 is planarized, an etch stop layer (ESL) 217 is deposited over the workpiece 200 and a third dielectric layer 219 is deposited over the ESL 217. A gate contact opening is formed through the third dielectric layer 219, the ESL 217, and the gate SAC dielectric layer 214 to expose the gate structure 210. A gate contact 216 is then deposited in the gate contact opening. In some implementations, a glue layer 205 may be deposited between the gate structure 210 and the gate contact 216 to improve adhesion and reduce contact resistance. A drain contact via opening is formed through the third dielectric layer 219, the ESL 217, and the second dielectric layer 215-2 to expose the source/drain contact 218 disposed over the drain epitaxial feature 212D. The drain contact via 220 is then formed in the drain contact via opening to couple to the drain epitaxial feature 212D. As shown in FIGS. 2A and 2B, no source contact via is formed over the source epitaxial feature 212S.

In some embodiments, the CESL 213 and the ESL 217 may be formed of silicon nitride, silicon oxide, silicon oxynitride, and/or other materials known in the art. The first dielectric layer 215-1, the second dielectric layer 215-2, and third dielectric layer 219 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contact 218, the drain contact via 220 and the gate contact 216 may be formed of (TiN), titanium (Ti), ruthenium (Ru), nickel (Ni), cobalt (Co), copper (Cu), molybdenum (Mo), tungsten (W), tantalum (Ta), or tantalum nitride (TaN). The source/drain contact silicide layer 2180 may include titanium silicide (TiSi), titanium silicon nitride (TiSiN), tantalum silicide (TaSi), tungsten silicide (WSi), cobalt silicide (CoSi), or nickel silicide (NiSi). The glue layer 205 may include titanium nitride (TiN). The gate SAC dielectric layer 214 may include silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), or silicon oxide (SiO).

Referring to FIGS. 1, 2A and 2B, method 100 includes a block 106 where a carrier substrate 222 is bonded on a front side of the workpiece 200. After the formation of the gate contact 216 and the drain contact via 220, an interconnect structure 221 may be formed over the front side of the workpiece 200. While not illustrated in the detail, the interconnect structure 221 may include a plurality of conductive line layers formed in a plurality of intermetal dielectric (IMD) layers. The plurality of the conductive line layers in the interconnect structure 221 may be vertically connected by a plurality of contact vias. In some implementations, the interconnect structure 221 may include a plurality of back-end-of-line (BEOL) devices, such as power transistors and metal-insulator-metal (MIM) capacitors. At block 106, a carrier substrate 222 is bonded to the interconnect structure 221 by hybrid bonding, fusion bonding, by use of an adhesion layer, or a combination thereof. In some instances, the carrier substrate 222 may be formed of semiconductor materials, sapphire, glass, polymeric materials, or other suitable materials. It is noted that the interconnect structure 221 and the carrier substrate 222 are only illustrated in FIGS. 2A and 2B and omitted from the rest of the figures for simplicity. For avoidance of doubts, throughout the present disclosure, a front side of the workpiece 200 refers to the side adjacent the interconnect structure 221 and a backside of the workpiece 200 refers to the side away from the interconnect structure 221.

Figures 3A, 3B:
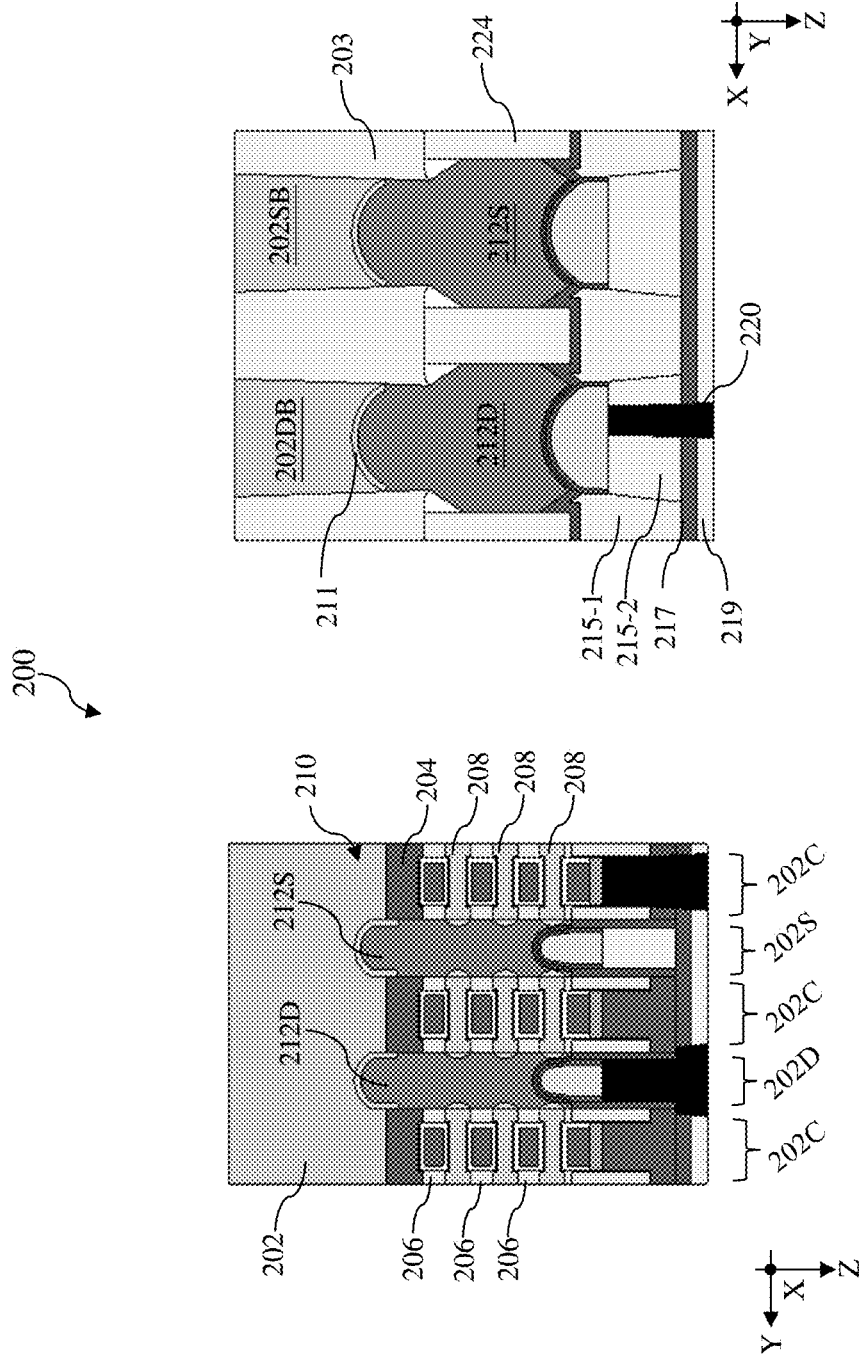

Referring to FIGS. 1, 3A, 3B, 4A and 4B, method 100 includes a block 108 where the workpiece 200 is flipped over and a first patterned hard mask 226-1 is formed over a drain base portion 202DB over the drain epitaxial feature 212D. After the bonding of the carrier substrate 222 to the workpiece 200, the workpiece 200 is flipped over, as shown in FIGS. 3A and 3B. It is noted that the X, Y, Z direction indicators are also flipped along with the workpiece 200 and the backside of the workpiece 200 is now faced up. As shown in FIG. 3B, the substrate 202 may be ground or planarized until top surfaces of the isolation feature 203, the top surface of the drain base portion 202DB, and the top surface of the source base portion 202SB are coplanar. Reference is now made to FIGS. 4A and 4B, a first patterned hard mask 226-1 is formed over the workpiece 200 to expose the source base portion 202SB over the source epitaxial feature 212S. To form the first patterned hard mask 226-1, a hard mask material layer is blanketly deposited over the workpiece 200 by chemical vapor deposition (CVD) or atomic layer deposition (ALD) or a suitable process and a photoresist layer 228 is deposited over the hard mask material layer. The photoresist layer 228 is then baked in a pre-bake process, exposed to a radiation reflected from or transmitting through a photomask, baked in a post-bake process, and developed in a developer solution to form a patterned photoresist layer 228. The hard mask material layer is then etched using the patterned photoresist layer 228 to form the first patterned hard mask 226-1. The first patterned hard mask 226-1 may be a single layer or a multi-layer. In some embodiments, the first patterned hard mask 226-1 may include silicon oxide, silicon nitride, silicon oxynitride, silicon carbonitride, or silicon oxycarbonitride.

Referring to FIGS. 1, 5A and 5B, method 100 includes a block 110 where the substrate 202 is etched using the first patterned hard mask 226-1 as an etch mask to remove a source base portion 202SB over the source epitaxial feature 212S. At block 110, the source base portion 202SB exposed in the first patterned hard mask 226-1 is anisotropically etched in an etch process that is not selective to silicon or silicon germanium. In some instances, the etch process may be a dry etch process that uses a gas mixture of chlorine ($Cl_2$), Oxygen ($O_2$), a carbon-and-fluorine containing gas, a bromine-and-fluorine containing gas, and a carbon-hydrogen-and-fluorine containing gas. In one example, the dry etch process includes a gas mixture of $Cl_2$, $O_2$, $CF_4$, $BCl_3$, and $CHF_3$. As a result, the etch process also etches the bottom dielectric layer 204 and results in rounded corners 2040. The source epitaxial feature 212S is also recessed at block 110. In some embodiments represented in FIGS. 5A and 5B, a top surface of the source epitaxial feature 212S is recessed to a level below the bottom dielectric layer 204 and the isolation feature 203. At the conclusion of operations at block 110, a backside source contact trench 236 is formed. As shown in FIGS. 5A and 5B, the backside source contact trench 236 extends through the isolation feature 203 and the bottom dielectric layers 204.

Figures 6A, 6B:
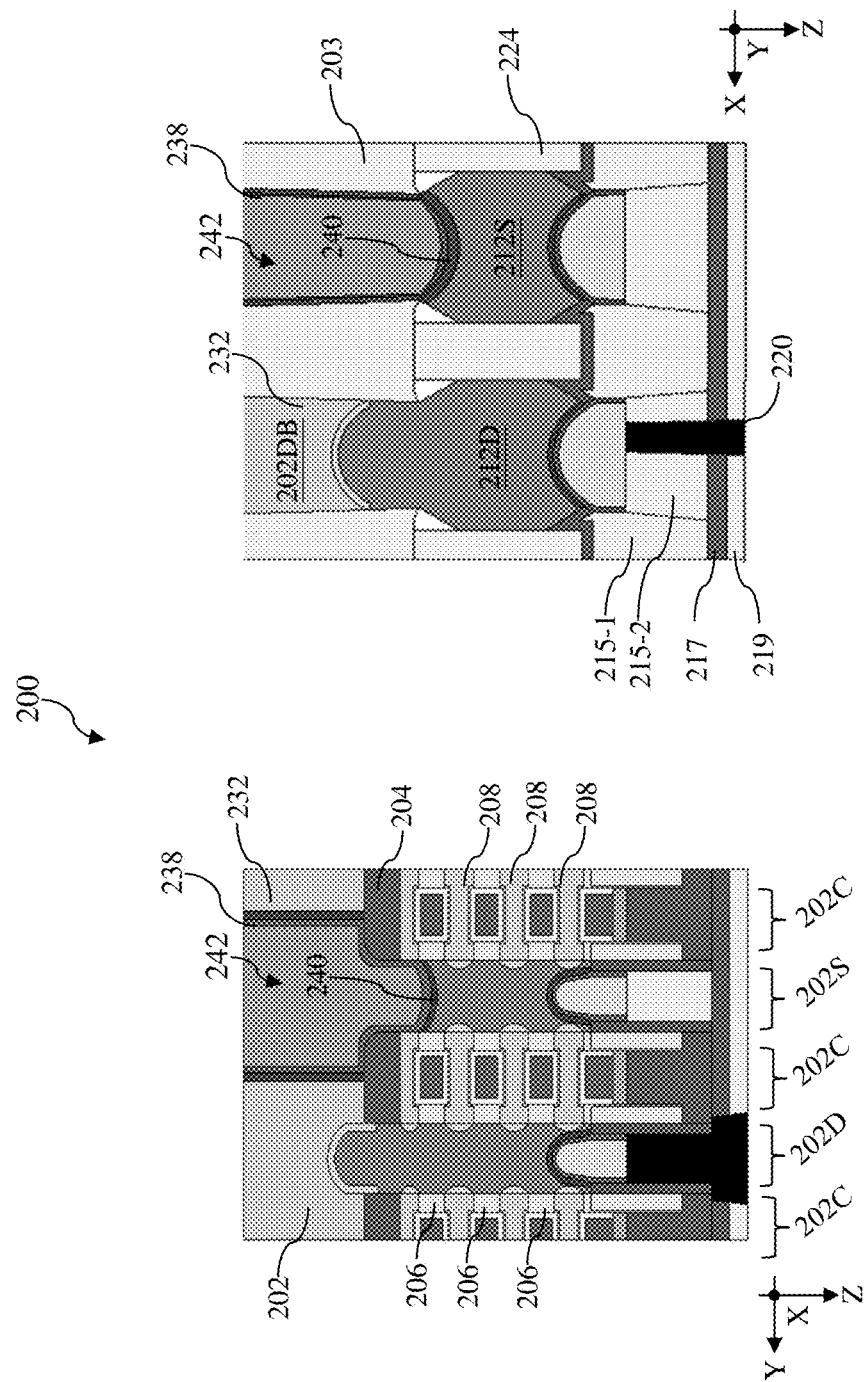

Referring to FIGS. 1, 6A and 6B, method 100 includes a block 112 where a silicide layer 240 is formed on the source epitaxial feature 212S. After the source epitaxial feature 212S is exposed and recessed at block 110, a pre-clean process may be performed to remove oxide contamination from the source epitaxial feature 212S. After the pre-clean process, a metal precursor is deposited over the workpiece 200 by physical vapor deposition (PVD) or CVD and is annealed to cause silicidation between the metal precursor and silicon in the source epitaxial feature 212S. As a result, a silicide layer 240 is formed on the source epitaxial feature 212S. As shown in FIGS. 6A and 6B, the metal precursor may also be deposited on sidewalls of the backside source contact trench 236. That is, the metal precursor may be in contact with the isolation feature 203, the bottom dielectric layer 204, and the top surface of the source epitaxial feature 212S. In some embodiments represented in FIGS. 6A and 6B, the metal precursor on the isolation feature 203, the bottom dielectric layer 204, and the source epitaxial feature 212S may be nitridated in a nitrogen ambient to form a liner 238. In some implementations, the metal precursor may include nickel, cobalt, titanium, tantalum, platinum, tungsten, other noble metals, other refractory metals, other rare earth metals, or alloys thereof. The silicide layer 240 may include a silicide of the metal precursor. For example, the silicide layer 240 may be formed of titanium silicide, tantalum silicide, or cobalt silicide. The liner 238 may include titanium silicon nitride, tantalum silicon nitride, or cobalt silicon nitride.

Referring to FIGS. 1, 6A and 6B, method 100 includes a block 114 where a metal fill layer is deposited on the silicide layer 240 to form a backside source contact 242. The metal fill layer may include (TiN), titanium (Ti), ruthenium (Ru), nickel (Ni), cobalt (Co), copper (Cu), molybdenum (Mo), tungsten (W), tantalum (Ta), or tantalum nitride (TaN), and may be deposited using PVD, CVD, ALD, or electroless plating. After the deposition of the metal fill layer into the backside source contact trench 236, the workpiece 200 is planarized by a planarization process, such as a chemical mechanical polishing (CMP) process, to remove excess materials and to form the backside source contact 242. After the planarization process, top surfaces of the substrate 202, the liner 238 and the backside source contact 242 may be coplanar. In some instances, the silicide layer 240 may have a thickness between about 1 nm and about 10 nm.

Figure 7B:
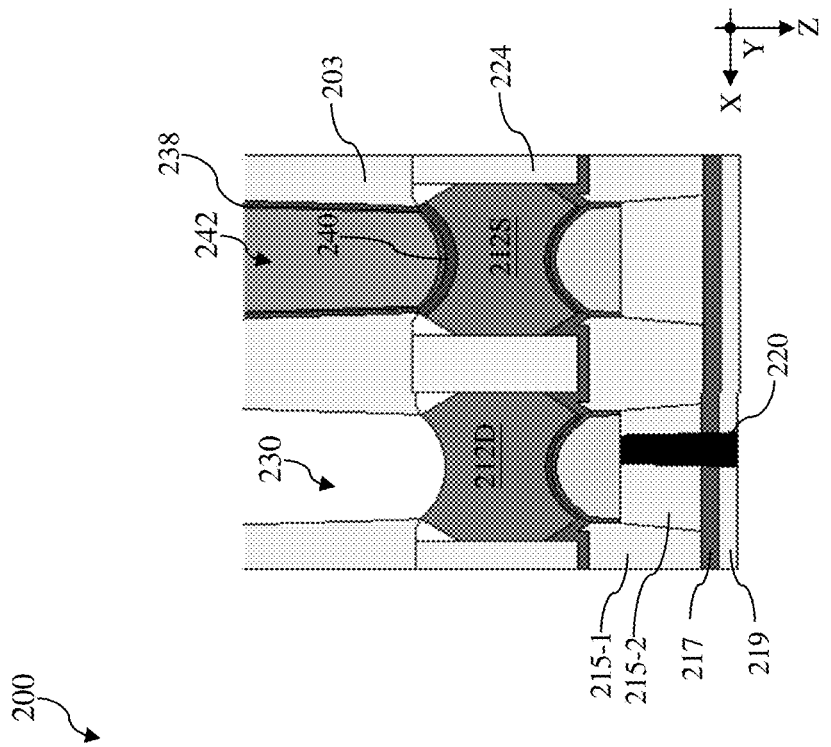
Figure 7A:
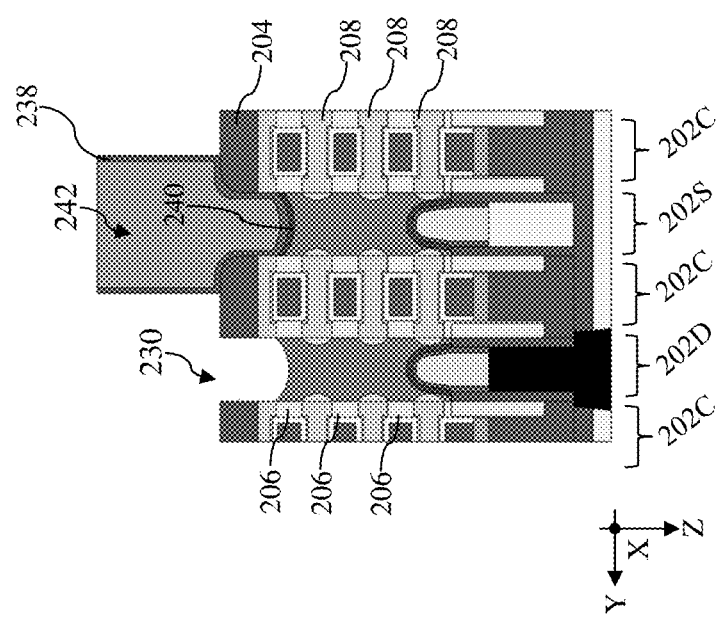

Referring to FIGS. 1, 7A and 7B, method 100 includes a block 116 where a drain base portion 202DB over the drain epitaxial feature 212D is selectively removed to expose the drain epitaxial feature 212D in a drain recess trench 230. In some embodiments, the drain base portion 202DB, which is formed from and part of the substrate 202, is isotropically and selectively etched in an etch process without use of any hard mask layer. Because the etch process at block 116 is selective to semiconductor materials of the substrate 202, the bottom dielectric layer 204 in the drain recess trench 230 is substantially free of the rounded corners 2040 shown in FIG. 5A. An example etch process at block 116 may be a wet etch process that uses diluted fluoric acid (DHF) and nitric acid solutions.

Referring to FIGS. 1, 7A and 7B, method 100 includes a block 118 where the drain epitaxial feature 212D is recessed. After the drain epitaxial feature 212D is exposed after operations at block 116, the selective etch process used in block 116 continues to recess the drain epitaxial feature 212D until a top surface of the drain epitaxial feature 212D is lower than the bottom dielectric layer 204 and a bottom surface of the isolation feature 203. Compared to the un-recessed drain epitaxial feature 212D in FIG. 3A, the recessed drain epitaxial feature 212D in FIG. 7A forms a smaller gate-drain capacitance with the gate structure 210.

Referring to FIGS. 1, 8A and 8B, method 100 includes a block 120 where a fourth dielectric layer 234 is deposited over the workpiece 200. The fourth dielectric layer 234 may have a composition similar to that of the first dielectric layer 215-1, the second dielectric layer 215-2, and third dielectric layer 219. After the deposition of the fourth dielectric layer 234, the workpiece 200 is planarized using a planarization process, such as a CMP process, to remove excess materials and to expose the backside source contact 242.

Referring to FIGS. 1, 9A and 9B, method 100 includes a block 122 where a power rail line 244 in contact with the backside source contact 242 is formed. While not explicitly shown, the power rail line 244 may be defined in an insulation layer. In an example process, an insulation layer having a composition similar to the fourth dielectric layer 234 may be deposited over the workpiece 200 and a power rail trench may be patterned in the insulation layer. A metal fill material is then deposited into the power rail trench to form the power rail line 244. In some embodiments, the power rail line 244 may be formed of (TiN), titanium (Ti), ruthenium (Ru), copper (Cu), nickel (Ni), cobalt (Co), tungsten (W), tantalum (Ta), tantalum nitride (TaN), or molybdenum (Mo) and may be deposited using PVD, CVD, ALD, or electroless plating. A planarization process, such as a CMP process, may be performed to remove excess metal fill materials.

Upon conclusion of operations at block 122, a first MBC transistor 250 is substantially formed. The first MBC transistor 250 includes a plurality of channel members 208 extending between the drain epitaxial feature 212D and the source epitaxial feature 212S. The drain epitaxial feature 212D is accessed by the drain contact via 220 from the front side of the workpiece 200 and the source epitaxial feature 212S is accessed by the backside source contact 242 from the opposing back side of the workpiece 200. Although the drain epitaxial feature 212D is not accessed by any contact feature from the backside, it is recessed from the backside to reduce the gate-drain capacitance. As shown in FIG. 9A, the backside source contact 242 includes a first portion that extends through the bottom dielectric layer 204 and a second portion above the bottom dielectric layer 204. Along the Z direction, the first portion has a first depth D1 between about 0 nm and about 35 nm and the second portion has a second depth D2 between about 0 nm and 60 nm. In one embodiment, the first depth D1 is between about 5 nm and about 15 nm. In some embodiments, a portion of the fourth dielectric layer 234 extends between portions of the bottom dielectric layer 204 by a third depth D3 between about 0 nm and about 35 nm. In one embodiment, the third depth D3 is between about 5 nm and about 15 nm. Referring to FIG. 9B, along the y direction, the backside source contact 242 may have a width W between about 6 nm and about 40 nm. In one embodiment, the width W is between about 6 nm and about 10 nm.

Besides method 100 illustrated in FIG. 1, the present disclosure also provides an alternative example method 300 in FIG. 10. Method 300 will be described below in conjunction with fragmentary cross-sectional views in FIGS. 11A-22B. It is noted that, throughout the present disclosure, similar features may share similar reference numerals. Unless otherwise specified, features having the same reference numeral may share substantially the same formation processes and materials.

Figures 11A, 11B:
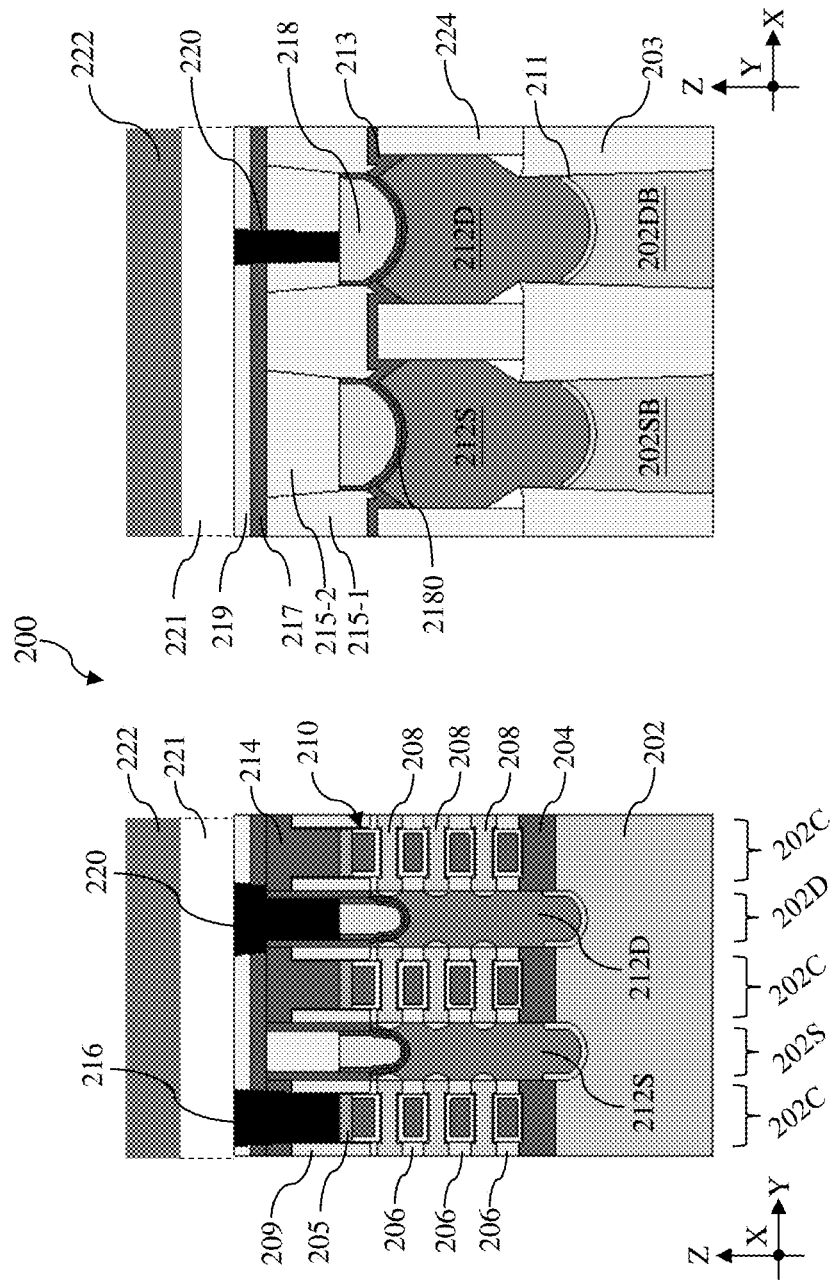

Referring to FIGS. 10, 11A and 11B, method 300 includes a block 302 where a workpiece 200 is provided. Because the structures and features shown in FIGS. 11A and 11B are similar to those illustrated in FIGS. 2A and 2B, detailed descriptions of the workpiece 200 shown in FIGS. 11A and 11B are omitted for brevity.

Referring still to FIGS. 10, 11A and 11B, method 300 includes a block 304 where a gate contact 216 and a drain contact via 220 are formed. Because the operations at block 304 are substantially similar to those described above with respect to block 104 of method 100, detailed descriptions of FIGS. 11A and 11B as well as the block 304 are omitted for brevity.

Referring to FIGS. 10, 11A and 11B, method 100 includes a block 306 where a carrier substrate 222 is bonded on a front side of the workpiece 200. Because the operations at block 306 are substantially similar to those at block 106 of method 100, detailed descriptions of operations at block 306 are omitted for brevity.

Figures 12A, 12B:
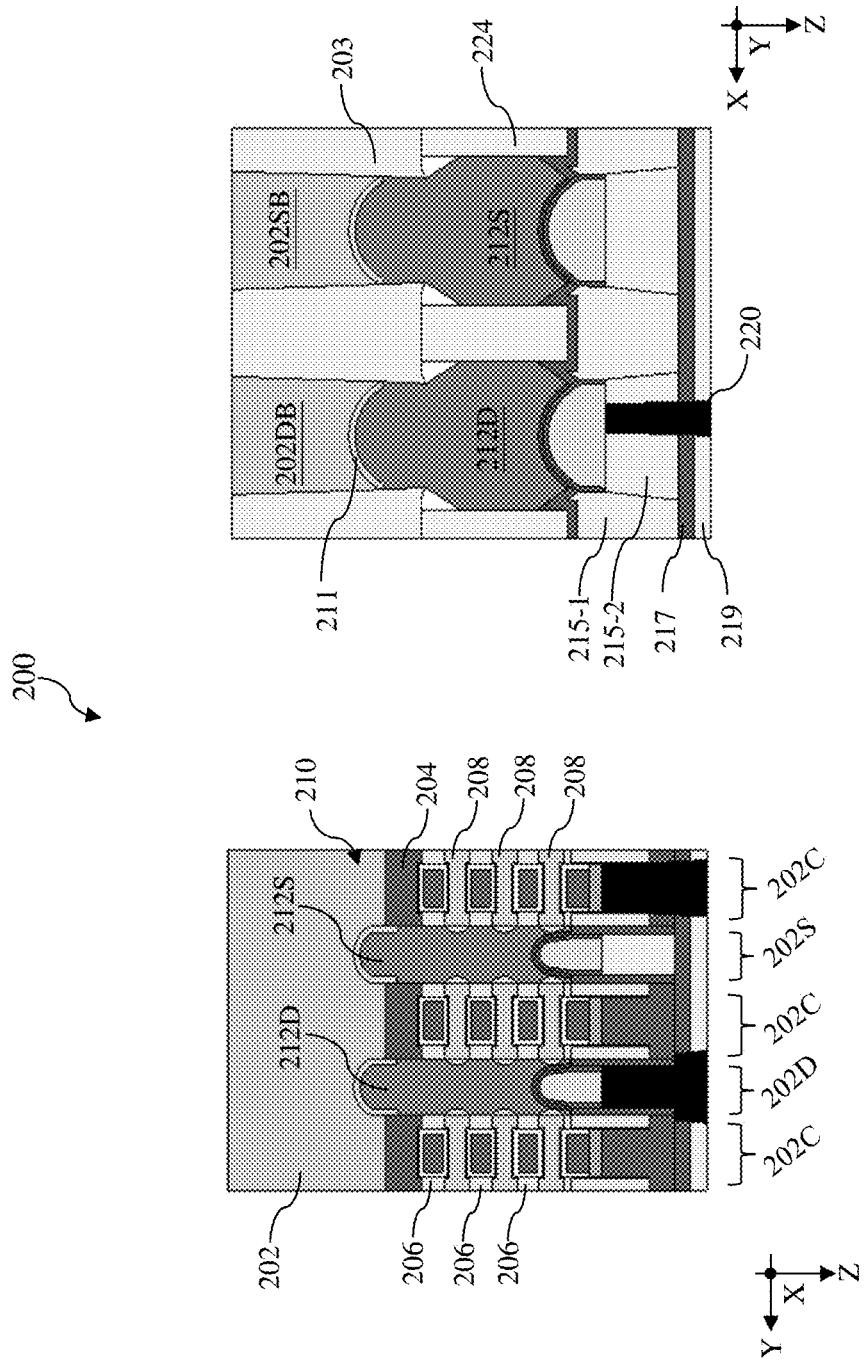
Figures 13A, 13B:
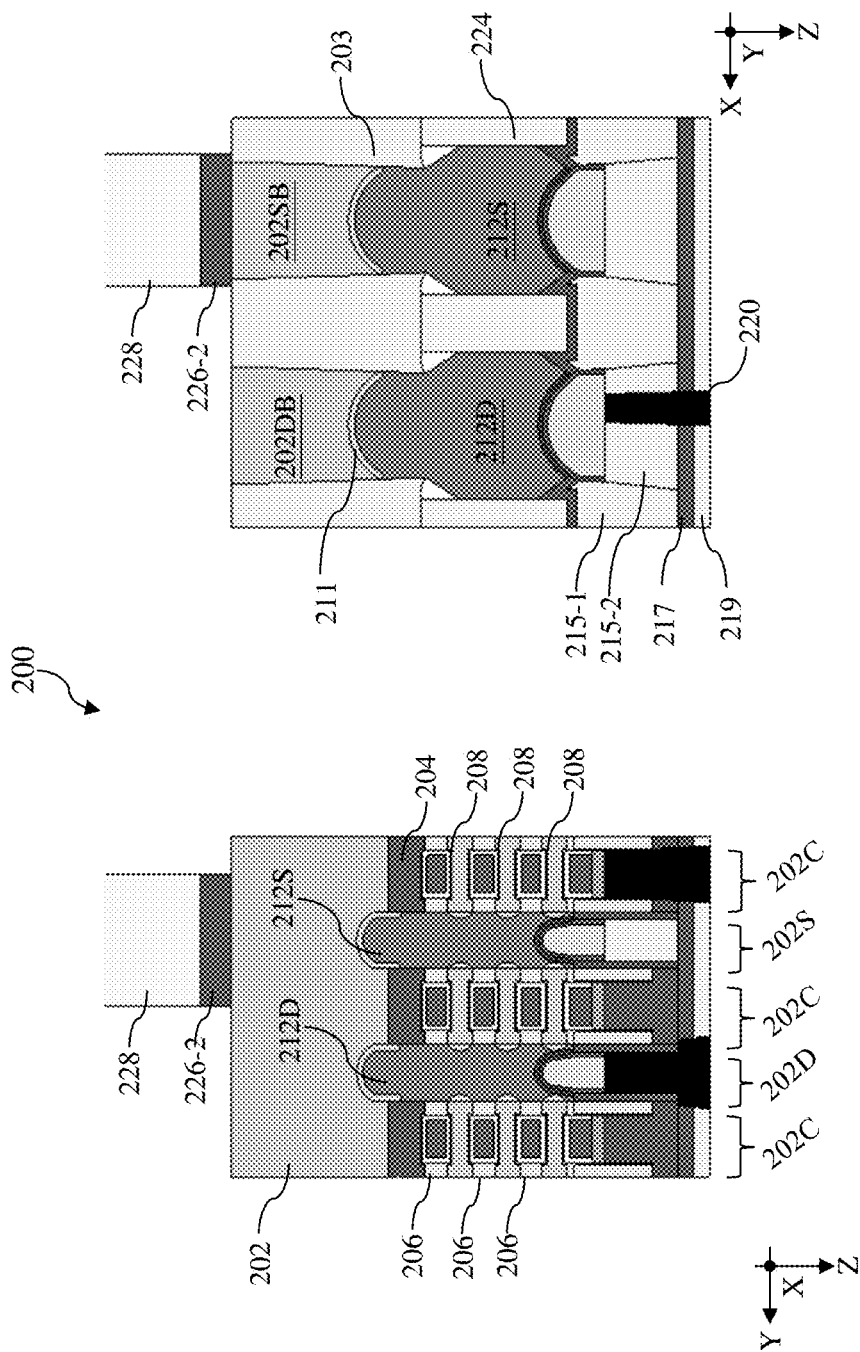

Referring to FIGS. 10, 12A, 12B, 13A, and 13B, method 300 includes a block 308 where the workpiece 200 is flipped over and a second patterned hard mask 226-2 is formed over a source base portion 202SB over the source epitaxial feature 212S. After the bonding of the carrier substrate 222 to the workpiece 200, the workpiece 200 is flipped over, as shown in FIGS. 12A and 12B. It is noted that the X, Y, Z direction indicators are also flipped along with the workpiece 200 and the backside of the workpiece 200 is now faced up. As shown in FIG. 12B, the substrate 202 may be ground or planarized until top surfaces of the isolation feature 203, the top surface of the drain base portion 202DB, and the top surface of the source base portion 202SB are coplanar. Reference is now made to FIGS. 13A and 13B, a second patterned hard mask 226-2 is formed over the workpiece 200 to expose the drain base portion 202DB over the drain epitaxial feature 212D. To form the second patterned hard mask 226-2, a hard mask material layer is blanketly deposited over the workpiece 200 by chemical vapor deposition (CVD) or atomic layer deposition (ALD) or a suitable process and a photoresist layer 228 is deposited over the hard mask material layer. The photoresist layer 228 is then baked in a pre-bake process, exposed to a radiation reflected from or transmitting through a photomask, baked in a post-bake process, and developed in a developer solution to form a patterned photoresist layer 228. The hard mask material layer is then etched using the patterned photoresist layer 228 to form the second patterned hard mask 226-2. The second patterned hard mask 226-2 may be a single layer or a multi-layer. In some embodiments, the second patterned hard mask 226-2 may include silicon oxide, silicon nitride, silicon oxynitride, silicon carbonitride, or silicon oxycarbonitride.

Figures 14A, 14B:
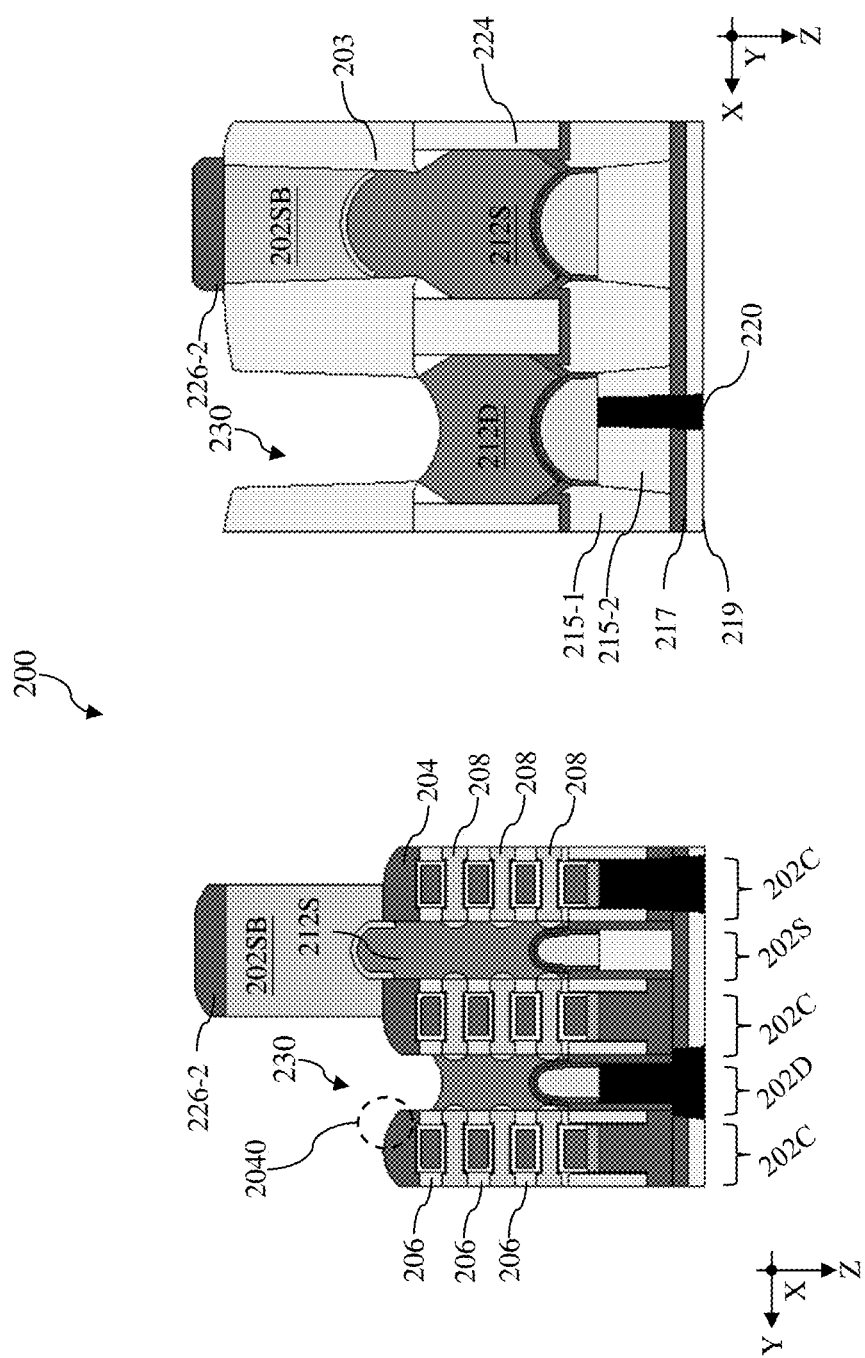

Referring to FIGS. 10, 14A and 14B, method 300 includes a block 310 where the substrate 202 is etched using the second patterned hard mask 226-2 as an etch mask to remove a drain base portion 202DB over the drain epitaxial feature 212D. At block 310, the drain base portion 202DB exposed in the second patterned hard mask 226-2 is anisotropically etched in an etch process that is not selective to silicon or silicon germanium. In some instances, the etch process may be a dry etch process that uses a gas mixture of chlorine ($Cl_2$), Oxygen ($O_2$), a carbon-and-fluorine containing gas, a bromine-and-fluorine containing gas, and a carbon-hydrogen-and-fluorine containing gas. In one example, the dry etch process includes a gas mixture of $Cl_2$, $O_2$, $CF_4$, $BCl_3$, and $CHF_3$. As a result, the etch process also etches the bottom dielectric layer 204 and results in rounded corners 2040. The drain epitaxial feature 212D is also recessed at block 310. In some embodiments represented in FIGS. 14A and 14B, a top surface of the drain epitaxial feature 212D is recessed to a level below the bottom dielectric layer 204 and the isolation feature 203. At the conclusion of operations at block 310, a backside drain recess trench 230 is formed. As shown in FIGS. 14A and 14B, the backside drain recess trench 230 extends through the isolation feature 203 and the bottom dielectric layers 204.

Figures 15A, 15B:
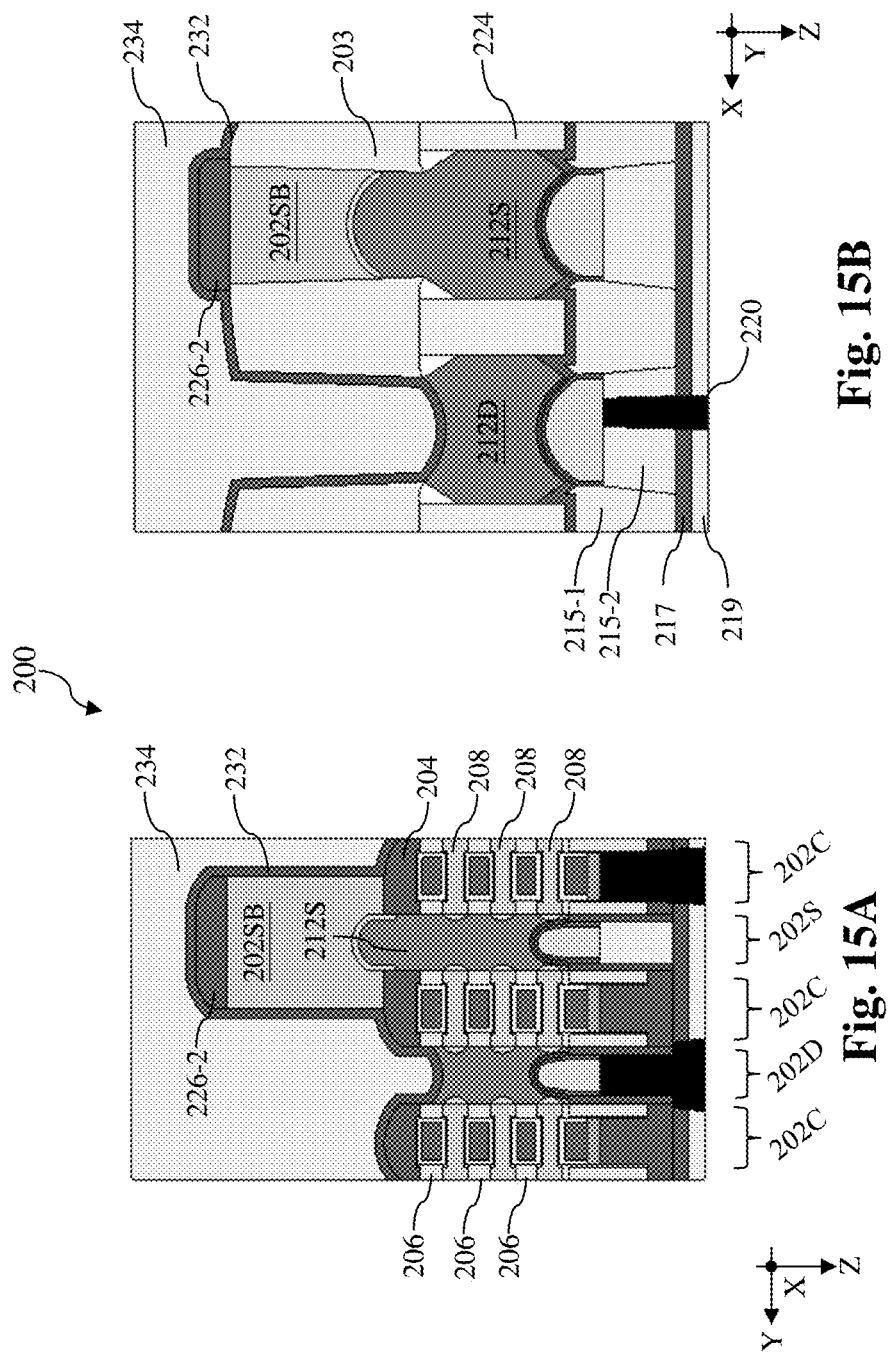

Referring to FIGS. 10, 15A and 15B, method 300 includes a block 312 where a first liner 232 is deposited over the workpiece 200. As shown in FIGS. 15A and 15B, a first liner 232 is blanketly deposited over the workpiece 200. The first liner 232 is on and in contact with the bottom dielectric layer 204, sidewalls of the source base portion 202SB, the top surface and sidewalls of the second patterned hard mask 226-2. In some implementations, the first liner 232 may be deposited using CVD or ALD. The first liner 232 may be formed of silicon nitride, silicon carbide, silicon carbonitride, or a material having a different selectivity than the isolation feature 203. The first liner 232, which is formed of dense and oxygen-atom-free material, may function to isolate recessed drain epitaxial feature 212 from oxygen-containing dielectric materials, such as the fourth dielectric layer 234.

Referring to FIGS. 10, 15A and 15B, method 300 includes a block 314 where the fourth dielectric layer 234 is deposited over the first liner 232. The fourth dielectric layer 234 may have a composition similar to that of the first dielectric layer 215-1, the second dielectric layer 215-2, and third dielectric layer 219. In some implementations, the fourth dielectric layer 234 may be deposited using spin-on coating or CVD. As shown in FIGS. 15A and 15B, at block 314, the fourth dielectric layer 234 is deposited on and in contact with the first liner 232.

Figures 16A, 16B:
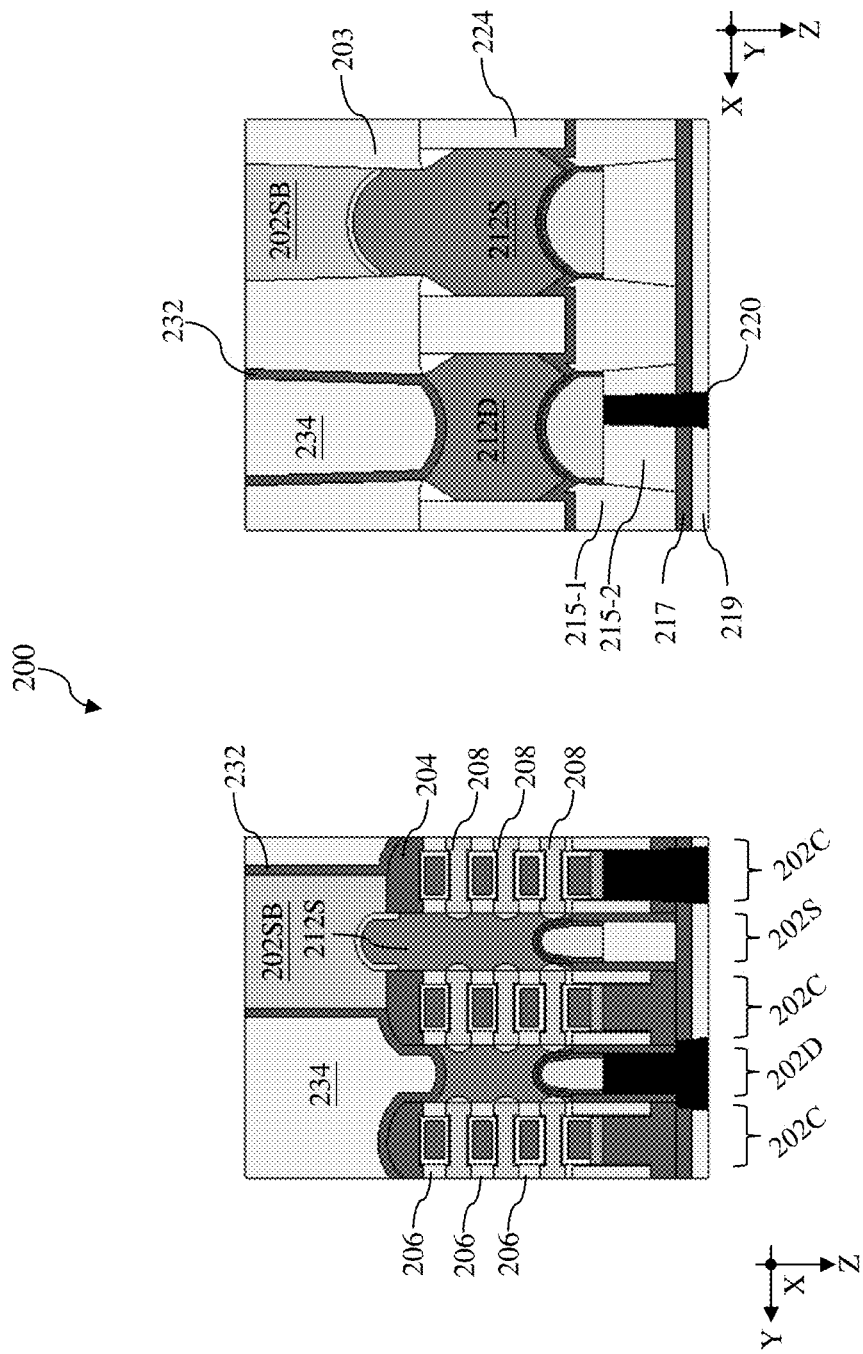

Referring to FIGS. 10, 16A and 16B, method 300 includes a block 316 where the workpiece 200 is planarized to expose the source base portion 202SB. As shown in FIGS. 16A and 16B, the workpiece 200 may be planarized in a planarization process, such as a CMP process, to remove the second patterned hard mask 226-2 and the first liner 232 on top-facing surfaces of the isolation feature 203 to provide a planar top surface. Upon conclusion of operations at block 316, the top surface of the source base portion 202SB is exposed.

Referring to FIGS. 10, 17A and 17B, method 300 includes a block 318 where the source base portion 202SB is selectively removed to form a source contact trench 236. In some embodiments, the source base portion 202SB, which is formed from and part of the substrate 202, is isotropically and selectively etched in an etch process without use of any hard mask layer. Because the etch process at block 318 is selective to semiconductor materials of the substrate 202, the bottom dielectric layer 204 in the drain recess trench 230 is substantially free of the rounded corners 2040 shown in FIG. 14A. An example etch process at block 318 may be a wet etch process that uses diluted fluoric acid (DHF) and nitric acid solutions. As shown in FIG. 17A, sidewalls of the source contact trench 236 on the X-Z plane is lined by the first liner 232. At block 318, after the selective removal of the source base portion 202SB, the source epitaxial feature 212S is recessed. In some instances, the top surface of the source epitaxial feature 212S is recessed to a level below the bottom dielectric layer 204 and the isolation feature 203.

Figures 18A, 18B:
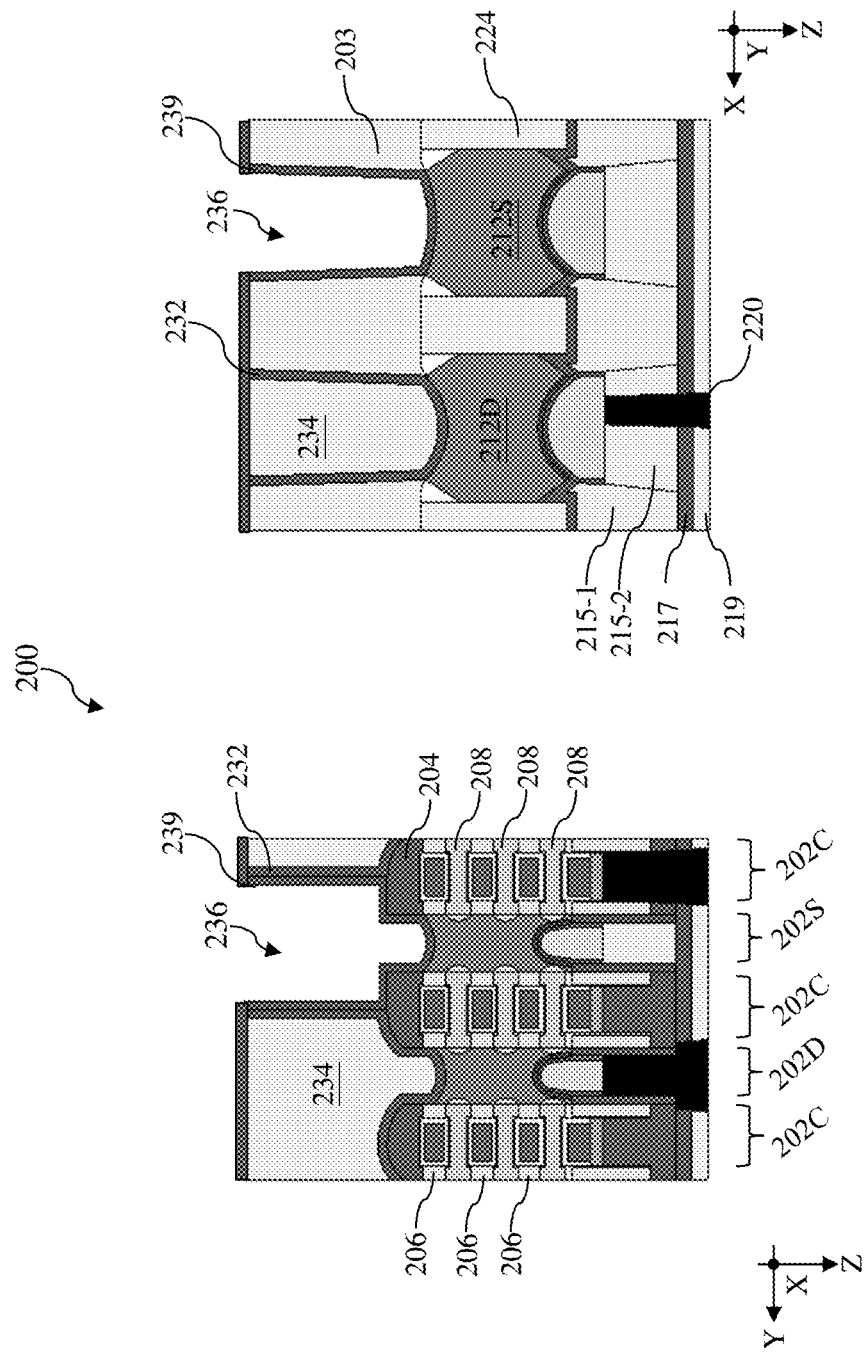

Referring to FIGS. 10, 18A and 18B, method 300 includes a block 320 where a second liner 239 is deposited over the source contact trench 236. As shown in FIGS. 18A and 18B, the second liner 239 is blanketly deposited over the workpiece 200 to line sidewalls of the source contact trench 236. In addition, the second liner 239 is on and in contact with the top surface of the fourth dielectric layer 234, the isolation feature 203, the top surface of the source epitaxial feature 212S, and the first liner 232 that lines sidewalls of the source contact trench 236 (along the X-Z plane shown in FIG. 18A). In some implementations, the second liner 239 may be deposited using CVD or ALD. The second liner 239 may be formed of silicon nitride, silicon carbide, silicon carbonitride, or a material having a different selectivity than the isolation feature 203 or the fourth dielectric layer 234.

Figures 19A, 19B:
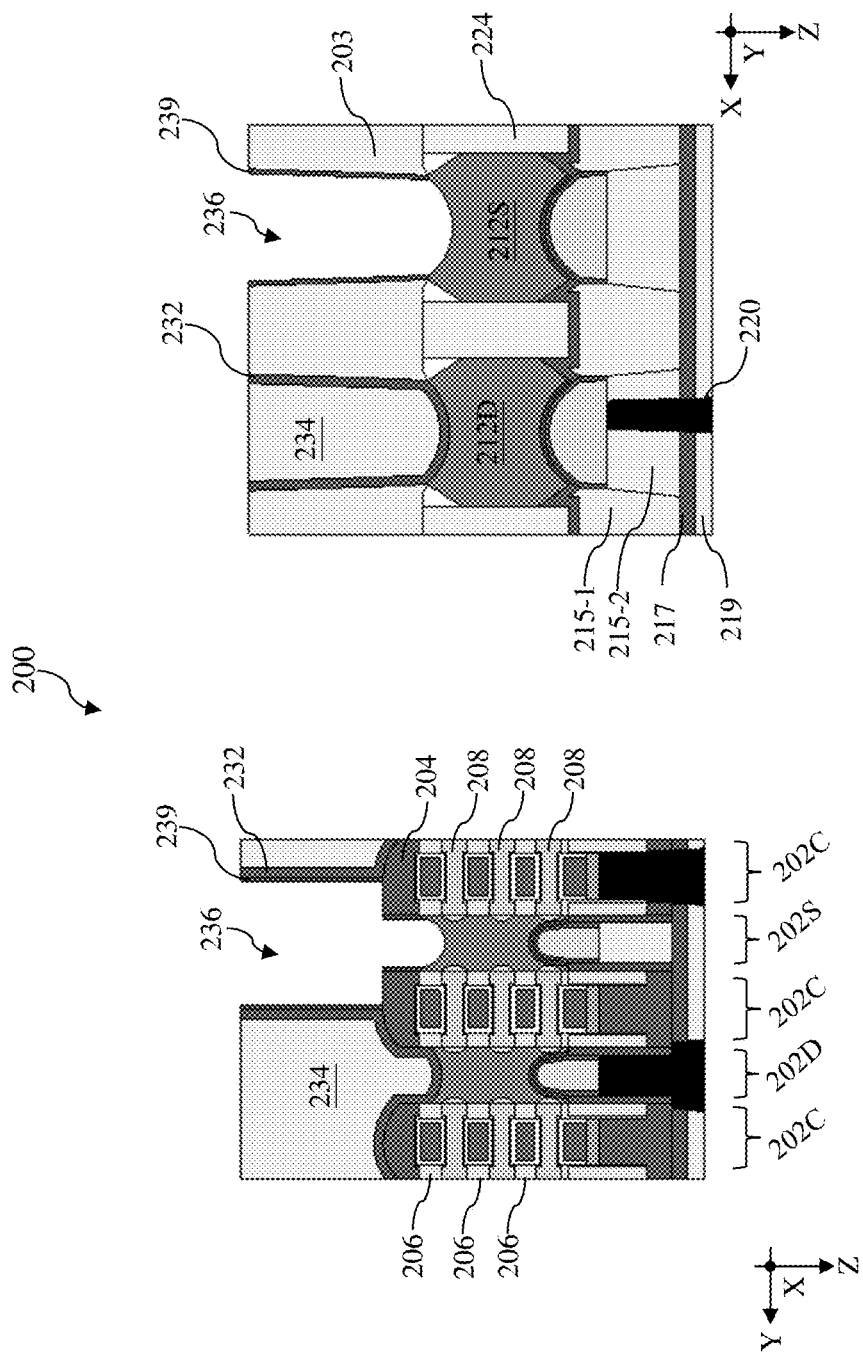

Referring to FIGS. 10, 19A and 19B, method 300 includes a block 322 where the second liner 239 is anisotropically recessed to expose the source epitaxial feature 212S. In some instances, the anisotropic etch process may be a dry etch process that uses a gas mixture of chlorine ($Cl_2$), nitrogen ($N_2$), a carbon-and-fluorine containing gas, a bromine-and-fluorine containing gas, and a carbon-hydrogen-and-fluorine containing gas. In one example, the dry etch process includes a gas mixture of $Cl_2$, $N_2$, $CF_4$, $BCl_3$, and $CHF_3$. As shown in FIGS. 19A and 19B, upon conclusion of operations at block 322, the second liner 239 on top-facing surfaces of the workpiece 200 is removed. As a result, the top surfaces of the fourth dielectric layer 234, the isolation feature 203, the first liner 232, the bottom dielectric layer 204, and the source epitaxial feature 212S are exposed. Operations at block 322 does not remove the second liner 239 on sidewalls of the source contact trench 236. Because the second liner 239 is recessed at block 322, along the sidewalls of the source contact trench 236, a thickness of the second liner 239 is smaller than a thickness of the first liner 232. In some embodiments, the first liner 232 may have a thickness between about 3 nm and about 10 nm and the second liner 239 may have a thickness between about 1 nm and about 5 nm.

Figures 20A, 20B:
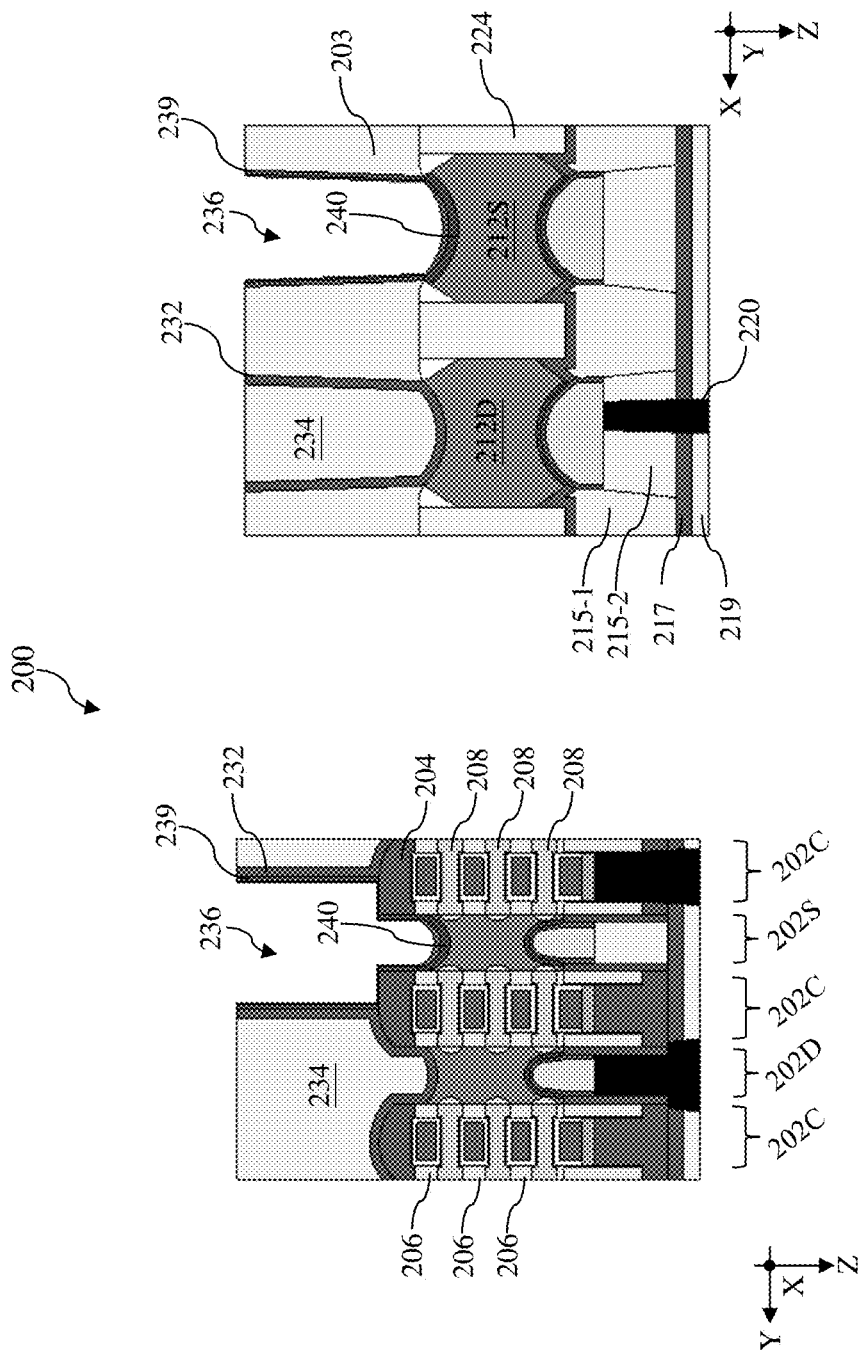

Referring to FIGS. 10, 20A and 20B, method 300 includes a block 324 where a silicide layer 240 is formed on the source epitaxial feature 212S. After the source epitaxial feature 212S is exposed and recessed at block 322, a pre-clean process may be performed to remove oxide contamination from the source epitaxial feature 212S. After the pre-clean process, a metal precursor is deposited over the workpiece 200 by physical vapor deposition (PVD) or CVD and is annealed to cause silicidation between the metal precursor and silicon in the source epitaxial feature 212S. As a result, a silicide layer 240 is formed on the source epitaxial feature 212S. As shown in FIGS. 20A and 20B, the metal precursor may also be deposited on sidewalls of the backside source contact trench 236. That is, the metal precursor may be in contact with that the isolation feature 203, the second liner 239 on sidewalls of the source contact trench 236, the bottom dielectric layer 204, and the top surface of the source epitaxial feature 212S. In some embodiments represented in FIGS. 20A and 20B, a portion of the silicide layer 240 may be nitridated in a nitrogen ambient to form metal silicon nitride. In some implementations, the metal precursor may include titanium, tantalum, or cobalt. The silicide layer 240 may include titanium silicide, tantalum silicide, cobalt silicide, titanium silicon nitride, tantalum silicon nitride, or cobalt silicon nitride.

Figures 21A, 21B:
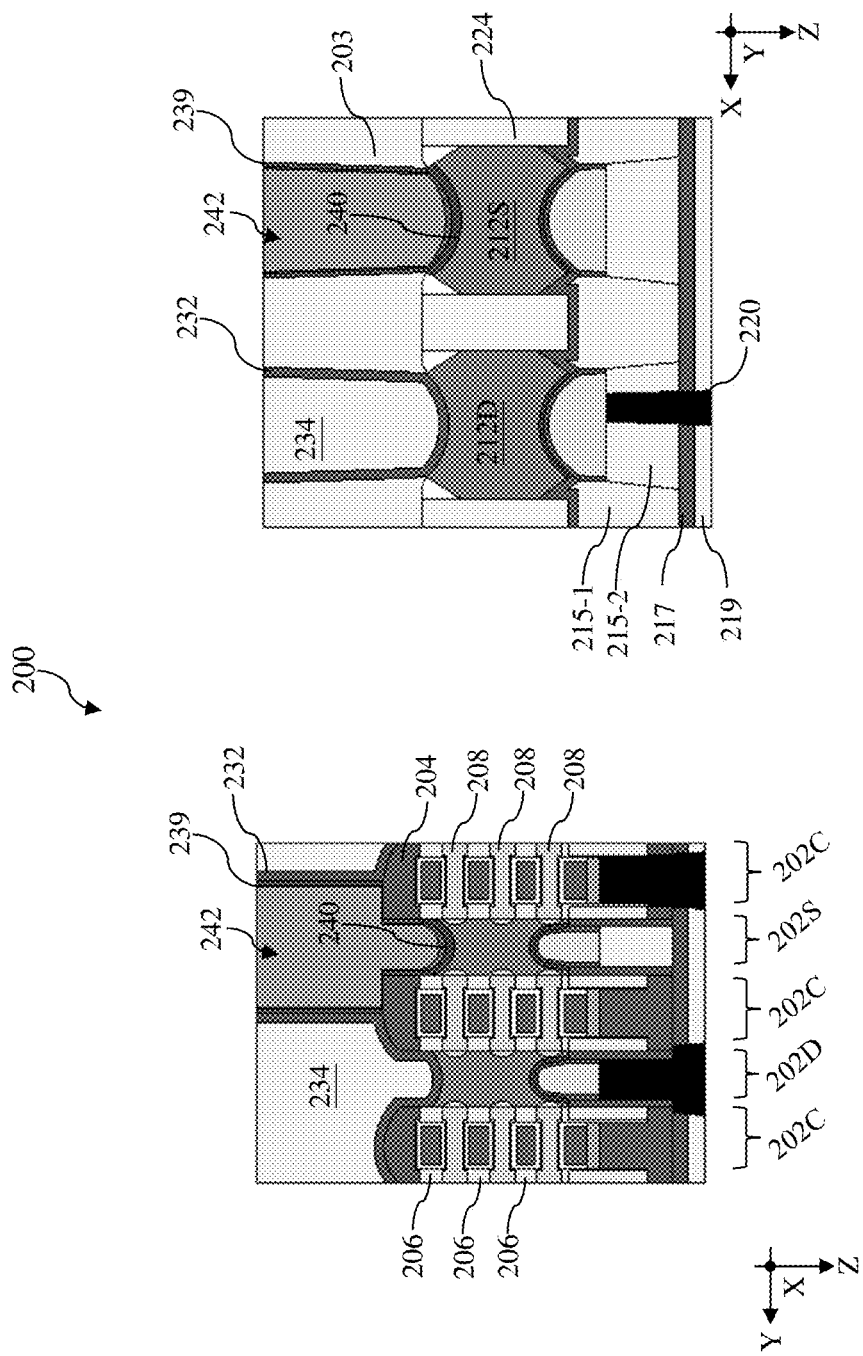

Referring to FIGS. 10, 21A and 21B, method 300 includes a block 326 where a metal fill layer is deposited in the source contact trench to form a backside source contact 242. The metal fill layer may include (TiN), titanium (Ti), ruthenium (Ru), copper (Cu), nickel (Ni), cobalt (Co), tungsten (W), tantalum (Ta), tantalum nitride (TaN), or molybdenum (Mo) and may be deposited using PVD, CVD, ALD, or electroless plating. After the deposition of the metal fill layer into the backside source contact trench 236, the workpiece 200 is planarized by a planarization process, such as a chemical mechanical polishing (CMP) process, to remove excess materials and to form the backside source contact 242. After the planarization process, top surfaces of the substrate 202, the liner 238 and the backside source contact 242 may be coplanar.

Figures 22A, 22B:
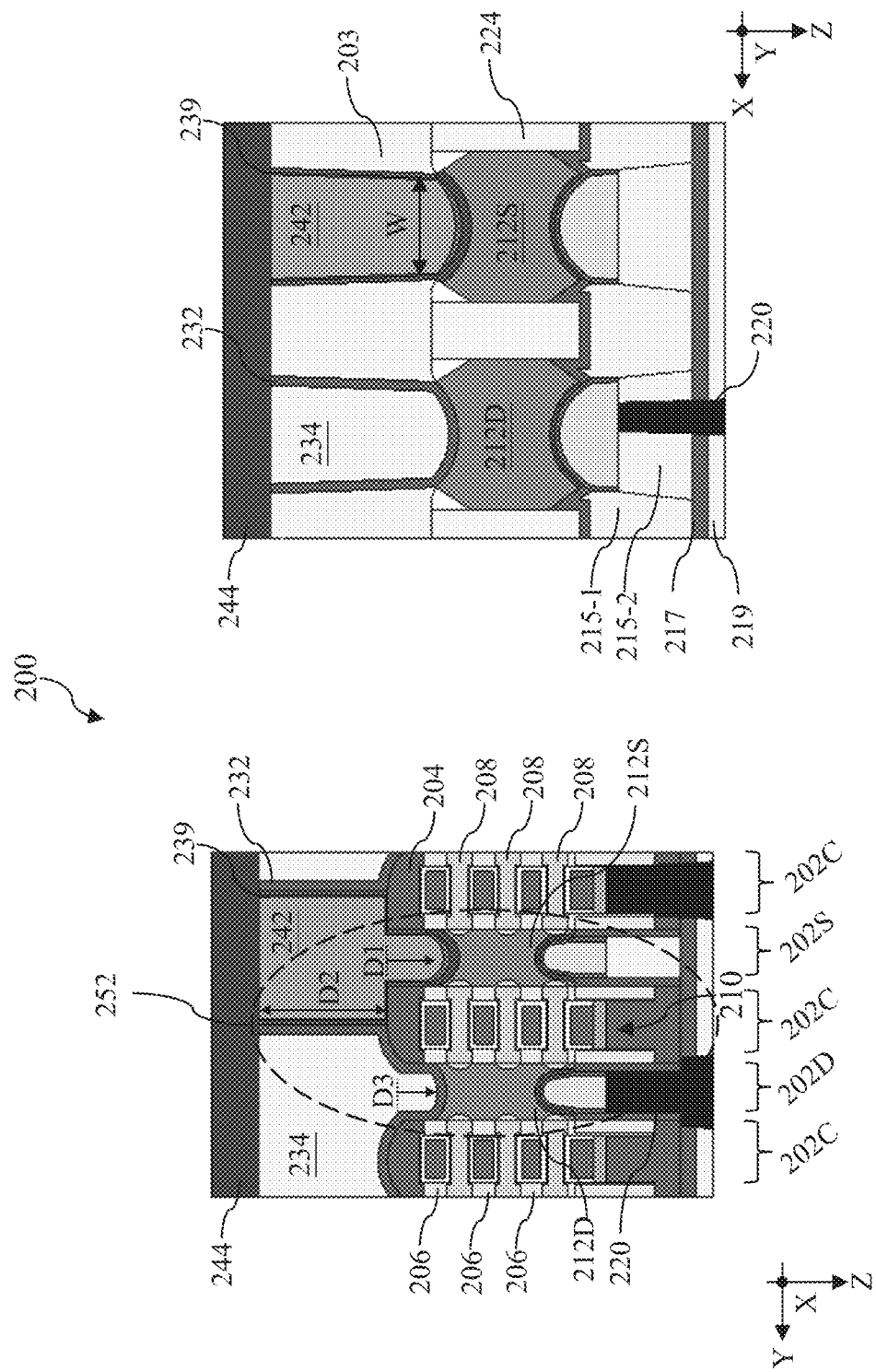

Referring to FIGS. 10, 22A and 22B, method 300 includes a block 328 where a power rail line 244 in contact with the backside source contact 242 is formed. While not explicitly shown, the power rail line 244 may be defined in an insulation layer. In an example process, an insulation layer having a composition similar to the fourth dielectric layer 234 may be deposited over the workpiece 200 and a power rail trench may be patterned in the insulation layer. A metal fill material is then deposited into the power rail trench to form the power rail line 244. In some embodiments, the power rail line 244 may be formed of (TiN), titanium (Ti), ruthenium (Ru), copper (Cu), nickel (Ni), cobalt (Co), tungsten (W), tantalum (Ta), tantalum nitride (TaN), or molybdenum (Mo) and may be deposited using PVD, CVD, ALD, or electroless plating. A planarization process, such as a CMP process, may be performed to remove excess metal fill materials.

Upon conclusion of operations at block 326, a second MBC transistor 252 is substantially formed. The second MBC transistor 252 includes a plurality of channel members 208 extending between the drain epitaxial feature 212D and the source epitaxial feature 212S. The drain epitaxial feature 212D is accessed by the drain contact via 220 from the front side of the workpiece 200 and the source epitaxial feature 212S is accessed by the backside source contact 242 from the opposing back side of the workpiece 200. Although the drain epitaxial feature 212D is not accessed by any contact feature from the backside, it is recessed from the backside to reduce the gate-drain capacitance. As shown in FIG. 22A, the backside source contact 242 includes a first portion that extends through the bottom dielectric layer 204 and a second portion above the bottom dielectric layer 204. Along the Z direction, the first portion has a first depth D1 between about 0 nm and about 35 nm and the second portion has a second depth D2 between about 0 nm and 60 nm. In one embodiment, the first depth D1 is between about 5 nm and about 15 nm. In some embodiments, a portion of the fourth dielectric layer 234 extends between portions of the bottom dielectric layer 204 by a third depth D3 between about 0 nm and about 35 nm. In one embodiment, the third depth D3 is between about 5 nm and about 15 nm. Referring to FIG. 22B, along the y direction, the backside source contact 242 may have a width W between about 6 nm and about 40 nm. In one embodiment, the width W is between about 6 nm and about 10 nm.

Embodiments of the present disclosure provide advantages. For example, the present disclosure provides embodiments of multi-gate transistors with a backside power rail and reduced gate-drain capacitance. In one embodiment, an MBC transistor according the present disclosure includes a plurality of vertically stacked channel members extending between a drain epitaxial feature and a source epitaxial feature. A gate structure wraps around each of the plurality of channel members. The drain epitaxial feature is accessed from a frontside adjacent the interconnect structure and the source epitaxial feature is accessed from a backside away from the interconnect structure. Although the drain epitaxial feature is not accessed from the backside, it is recessed from the backside to reduce gate-drain capacitance. As a result, the MBC transistor according to the present disclosure has improved performance.

In one exemplary aspect, the present disclosure is directed to a semiconductor device. The semiconductor device includes a first epitaxial feature and a second epitaxial feature, a plurality of channel members extending between the first epitaxial feature and the second epitaxial feature, a gate structure wrapping around each of the plurality of channel members, a bottom dielectric feature disposed over the gate structure, a first liner over the first epitaxial feature and a portion of the bottom dielectric feature, a dielectric layer disposed over the first liner, a silicide feature on and in direct contact with the second epitaxial feature, a backside contact over and in direct contact with the silicide feature, and a conductive line disposed over the dielectric layer and the backside contact.

In some embodiments, sidewalls of the backside contact are lined by a second liner. In some implementations, a thickness of the second liner is smaller than a thickness of the first liner. In some embodiments, a portion of the backside contact extends through the bottom dielectric feature. In some instances, a portion of the first liner and a portion of the dielectric layer extends through the bottom dielectric feature. In some embodiments, a portion of the backside contact is disposed over the bottom dielectric feature. In some instances, the silicide feature includes a metal silicide and a metal silicide nitride.

In another exemplary aspect, the present disclosure is directed to a method. The method includes providing a workpiece having a first epitaxial feature and a second epitaxial feature, a plurality of channel members extending between the first epitaxial feature and the second epitaxial feature, a gate structure wrapping around each of the plurality of channel members, a bottom dielectric feature disposed over the gate structure, a first substrate portion over the first epitaxial feature, and a second substrate portion over the second epitaxial feature. The method further includes selectively recessing the first substrate portion to expose the first epitaxial feature, depositing a first liner over the workpiece and the first epitaxial feature, depositing a first dielectric layer over the first liner, and planarizing the workpiece such that top surfaces of the first dielectric layer and the substrate portion are coplanar. In some embodiments, the selectively recessing to expose the first epitaxial feature includes recessing the first epitaxial feature. In some embodiments, the method may further include selectively recessing the second substrate portion to expose the second epitaxial feature in a backside contact trench, depositing a second liner over the workpiece and the backside contact trench, anisotropically recessing the second liner to expose a portion the second epitaxial feature, forming a silicide feature on the exposed portion of the second epitaxial feature, and depositing a metal material in the backside contact trench to form a backside contact. In some implementations, the method may further include planarizing the first dielectric layer, the first liner, the second liner, and the backside contact to form a planar surface, depositing a second dielectric layer on the planar surface, and forming a conductive line in the second dielectric layer such that the conductive line is in direct contact with the backside contact. In some embodiments, the selectively recessing the substrate portion to expose the second epitaxial feature includes recessing the second epitaxial feature. In some instances, a thickness of the second liner is smaller than a thickness of the first liner. In some instances, the first liner and the second liner include silicon nitride.

In yet another exemplary aspect, the present disclosure is directed to a method. The method includes providing a workpiece having a first epitaxial feature, a first semiconductor base portion over the first epitaxial feature, a second epitaxial feature, a second semiconductor base portion over the second epitaxial feature, a dielectric fin structure disposed between the first epitaxial feature and the second epitaxial feature, and an isolation feature disposed over the dielectric fin structure and along sidewalls of the first semiconductor base portion and the second semiconductor base portion. The method further includes forming a patterned hard mask over the workpiece, wherein the first semiconductor base portion is exposed in the patterned hard mask, etching the first semiconductor base portion using the patterned hard mask as an etch mask to expose the first epitaxial feature, depositing a first nitride liner over the first epitaxial feature and the isolation feature, and depositing a first dielectric layer over the first nitride liner.

In some embodiments, the etching includes recessing the first epitaxial feature. In some implementations, the method may further include planarizing the workpiece to remove the patterned hard mask such that top surfaces of the first nitride liner, the first dielectric layer, the isolation feature, and the second epitaxial feature are coplanar. In some embodiments, the method may further include recessing the second semiconductor base portion to expose the second epitaxial feature in a backside contact trench, recessing the exposed second epitaxial feature, depositing a second nitride liner over the recessed second epitaxial feature and the backside contact trench, and anisotropically recessing the second nitride liner to expose the second epitaxial feature. In some instances, the method may further include forming a silicide feature on the second epitaxial feature, and depositing a metal material in the backside contact trench to form a backside contact. In some embodiments, the method may further include planarizing the first dielectric layer, the first nitride liner, the second nitride liner, the isolation feature, and the backside contact to form a planar surface, depositing a second dielectric layer on the planar surface, and forming a conductive line in the second dielectric layer such that the conductive line is in direct contact with the backside contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source feature and a drain feature;
   a vertical stack of nanostructures extending between the source feature and the drain feature;
   a gate structure disposed over a bottom dielectric layer and wrapping around each of the vertical stack of nanostructures;
   a backside dielectric layer underlying the bottom dielectric layer and extending continuously below the drain feature; and
   a backside source contact extending through the bottom dielectric layer and the backside dielectric layer to electrically couple to the source feature.

2. The semiconductor structure of claim 1, further comprising:
   a first liner extending continuously from between the backside source contact and the backside dielectric layer to between the backside source contact and the bottom dielectric layer as well as from between the backside source contact and the bottom dielectric layer to between the source feature and the backside source contact.

3. The semiconductor structure of claim 2, wherein the first liner comprises titanium silicon nitride, tantalum silicon nitride, or cobalt silicon nitride.

4. The semiconductor structure of claim 2, further comprising:
   a silicide layer disposed between the first liner and the source feature.

5. The semiconductor structure of claim 1, wherein the backside dielectric layer is disposed below and in contact with the drain feature.

6. The semiconductor structure of claim 1,
   wherein the vertical stack of nanostructures extends between the source feature and the drain feature along a direction,
   wherein the bottom dielectric layer is disposed between a portion of the backside dielectric layer and a portion of the backside source contact along the direction,
   wherein the bottom dielectric layer comprises a rounded corner adjacent the portion of the backside source contact.

7. The semiconductor structure of claim 1, further comprising:
   a frontside source contact disposed over the source feature, wherein the frontside source contact comprises titanium nitride, titanium, ruthenium, nickel, cobalt, copper, molybdenum, tungsten, tantalum, or tantalum nitride.

8. The semiconductor structure of claim 7, further comprising:
   a frontside silicide layer disposed between the source feature and the frontside source contact, wherein the frontside silicide layer comprises titanium silicide, titanium silicon nitride, tantalum silicide, tungsten silicide, cobalt silicide, or nickel silicide.

9. A semiconductor structure, comprising:
   a backside dielectric feature;
   a first drain feature disposed over the backside dielectric feature;
   a backside source contact;
   a source feature disposed over the backside source contact;
   an isolation feature disposed between the backside dielectric feature and the backside source contact along a first direction;
   a dielectric fin disposed on the isolation feature and sandwiched directly between the source feature and the first drain feature along the first direction;
   a first liner disposed between the backside dielectric feature and the isolation feature; and
   a second liner disposed between the backside source contact and the isolation feature.

10. The semiconductor structure of claim 9, wherein the source feature and the first drain feature comprise silicon or silicon germanium.

11. The semiconductor structure of claim 9,
   wherein the dielectric fin comprises a high-k dielectric material and a low-k dielectric material,
   wherein the high-k dielectric material is selected from a group consisting of hafnium oxide, zirconium oxide, hafnium aluminum oxide, hafnium silicon oxide, and aluminum oxide, wherein the low-k dielectric material is selected from a group consisting of silicon carbonitride, silicon oxycarbide, and silicon oxycarbonitride.

12. The semiconductor structure of claim 9, wherein a composition of the first liner is different from a composition of the isolation feature.

13. The semiconductor structure of claim 9, wherein a composition of the second liner is different from a composition of the isolation feature.

14. The semiconductor structure of claim 9, wherein a thickness of the second liner is smaller than a thickness of the first liner.

15. The semiconductor structure of claim 9, further comprising:
   a second drain feature;
   a plurality of nanostructures extending between the source feature and the second drain feature along a second direction perpendicular to the first direction; and
   a gate structure wrapping around each of the plurality of nanostructures.

16. The semiconductor structure of claim 15,
   wherein the gate structure is disposed over a bottom dielectric layer,
   wherein the backside source contact is spaced apart from the bottom dielectric layer by the second liner.

17. The semiconductor structure of claim 16, wherein a portion of the second liner extends along a rounded corner of the bottom dielectric layer.

18. A semiconductor structure, comprising:
   a first epitaxial feature and a second epitaxial feature;
   a plurality of nanostructures extending between the first epitaxial feature and the second epitaxial feature;
   a gate structure wrapping around each of the plurality of nanostructures;
   a bottom dielectric feature disposed over the gate structure;
   a backside dielectric layer disposed over the first epitaxial feature; and
   a backside contact disposed over the second epitaxial feature,
   wherein the backside dielectric layer and the backside contact is spaced apart by a first liner adjacent the backside dielectric layer and a second liner adjacent the backside contact.

19. The semiconductor structure of claim 18, wherein a thickness of the second liner is smaller than a thickness of the first liner.

20. The semiconductor structure of claim 18,
   wherein the first liner is formed of an oxygen-free dielectric material,
   wherein a composition of the second liner is different from a composition of the bottom dielectric feature.

* * * * *